(12) United States Patent
Abe et al.

(10) Patent No.: US 8,385,874 B2
(45) Date of Patent: Feb. 26, 2013

(54) DISCRETE TIME DIRECT SAMPLING CIRCUIT AND RECEIVER

(75) Inventors: Katsuaki Abe, Cupertino, CA (US); Yoshifumi Hosokawa, Osaka (JP); Yasuyuki Naito, Osaka (JP); Kentaro Miyano, Osaka (JP); Noriaki Saito, Tokyo (JP)

(73) Assignee: Panasonic Corporation, Osaka (JP)

( * ) Notice: Subject to any disclaimer, the term of this patent is extended or adjusted under 35 U.S.C. 154(b) by 742 days.

(21) Appl. No.: 12/529,900

(22) PCT Filed: Mar. 3, 2008

(86) PCT No.: PCT/JP2008/000418
§ 371 (c)(1),
(2), (4) Date: Sep. 3, 2009

(87) PCT Pub. No.: WO2008/108090
PCT Pub. Date: Sep. 12, 2008

(65) Prior Publication Data
US 2010/0093302 A1    Apr. 15, 2010

(30) Foreign Application Priority Data

Mar. 6, 2007    (JP) .................. 2007-056409

(51) Int. Cl.
*H04B 1/26* (2006.01)
(52) U.S. Cl. ........ 455/323; 455/313; 455/326; 327/356; 327/358; 327/361
(58) Field of Classification Search .................... 455/323
See application file for complete search history.

(56) References Cited

U.S. PATENT DOCUMENTS

| 7,053,673 | B1 | 5/2006 | Yuan |
| 7,218,163 | B2* | 5/2007 | Hanke et al. .................. 327/358 |
| 7,274,916 | B2* | 9/2007 | Al-Shyoukh et al. ......... 455/130 |
| 2002/0181614 | A1 | 12/2002 | Mostafa |
| 2006/0057989 | A1* | 3/2006 | Wu ............................ 455/190.1 |
| 2008/0299937 | A1 | 12/2008 | Miyano |

FOREIGN PATENT DOCUMENTS

| EP | 1 411 639 | 4/2004 |
| JP | 2002-374181 | 12/2002 |
| JP | 2003-510933 | 3/2003 |
| JP | 2004-289793 | 10/2004 |
| JP | 2006-211153 | 8/2006 |
| JP | 2007-189666 | 7/2007 |
| WO | 01/24192 | 4/2001 |

OTHER PUBLICATIONS

International Search Report dated May 27, 2008.

\* cited by examiner

*Primary Examiner* — Duc Nguyen
*Assistant Examiner* — Ajibola Akinyemi
(74) *Attorney, Agent, or Firm* — Dickinson Wright PLLC

(57) ABSTRACT

Provided are a direct sampling circuit and a receiver using a discrete time analog process and having a filter effect of a steep attenuation characteristic in a narrow-pass band without lowering a sampling rate. In a discrete time direct sampling circuit (13), the positive phase side and the inverse phase side are both sampled by a local signal for a differential current output of a differential voltage/current conversion unit (1011) and electric charge is accumulated in a charge sampling capacitor. The latest accumulated charge at the positive phase side and charge accumulated at the inverse phase side before a predetermined number of samples are combined with the charge accumulated in a history capacitor (1043) in the past. Thus, it is possible to realize equivalently high-degree FIR filter characteristic.

17 Claims, 18 Drawing Sheets

DISCRETE TIME DIRECT SAMPLING CIRCUIT AND RECEIVER

TECHNICAL FIELD

The present invention relates to the technology of a discrete time direct sampling circuit and receiver having a discrete time direct sampling circuit.

BACKGROUND ART

A configuration has been disclosed that performs receiving processing by means of discrete time direct sampling of a high-frequency signal with the aim of achieving small size and low power consumption of a radio receiver and integrating the analog signal processor and digital signal processor (e.g. see Patent Document 1).

An example of the configuration of a discrete time direct sampling circuit using conventional discrete time processing and its sampling and filter processing operations will be described using FIG. 1. In FIG. 15, discrete time direct sampling circuit 1500 is provided with: differential voltage-to-current convertor 1501 that converts a received radio frequency ("RF") signal to differential current signals and outputs positive-phase analog RF current signal 1511 and negative-phase analog RF current signal 1512; sampling mixer 1502 that is comprised of, for example, a plurality of mixer switches, and that samples differential analog RF current signals that are received as input, based on a positive-phase local frequency signal (hereinafter "positive-phase LO signal") and negative-phase local frequency signal (hereinafter "negative-phase LO signal") having phases shifted by half the period to each other; electric charge integration processor 1503 that charges and integrates electric charges supplied by electric currents outputted from sampling mixer 1502; and control signal generator 1504 that generates local signals used for sampling and control signals used for integrating, charging and resetting an electric charge, for sampling mixer 1502 and electric charge integration processor 1503.

FIG. 2 illustrates a timing chart of control signals generated in control signal generator 1504. Here, a case commonly referred to as "zero IF reception" or "low IF reception," will be explained as an example. In the case of zero IF reception, a positive-phase LO signal and negative-phase LO signal are supplied to switch gates in sampling mixer 1502, and their frequency is substantially the same as the frequency of the analog RF signal. Also, signal D is supplied to the gates of integration switches 15031 and 15032 in electric charge integration processor 1503. Signal R is supplied to the gates of reset switches 15033 and 15034 in electric charge integration processor 1503.

An example given here is designed such that signal D turns "on" integration switches 15031 and 15032 over a time period matching six LO signal samples, signal R turns "on" reset switches 15033 and 15034 over a period of time matching one LO signal sample, and voltages proportional to the amounts of electric charge integrated and charged in capacitors are read at timings while the switches are turned "on" with signal D and signal R.

The operations of discrete time direct sampling circuit 1500 will be explained below. Differential voltage-to-current convertor 1501 converts an analog RF signal received as input, into differential analog RF current signals, and outputs the positive-phase and negative-phase analog RF current signals to sampling mixer 1502. The differential analog RF current signals are subjected to sampling through switches 15021 to 15024 in the sampling mixer using LO signals having substantially the same frequency as the analog RF signal. In electric charge integration processor 1503, the differential analog RF current signals, each sampled in sampling mixer 1502, are charged in integration capacitors 15035 and 15036, via integration switches 15031 and 15032, over a period of time of six LO signal samples. By this means, the electric charges supplied by the differential analog RF current signals are integrated over a duration of a period of six LO signal samples. Voltages proportional to the amounts of electric charges integrated and charged in integration capacitors 15035 and 15036 are read out from output ports 1513 and 1514 as discrete time analog signals during the holding period.

Here, the discrete time analog signals read out from output ports 1513 and 1514 are subjected to filter processing of two lowpass characteristics: a lowpass filter characteristic having a SINC function characteristic acquired by performing integration over a period matching approximately half of the period of the local signals; and a discrete time, FIR (Finite Impulse Response) lowpass filter characteristic acquired by adding frequency-domain discrete signals of the LO signals acquired as above over six samples, and their overall characteristics are shown in FIG. 3. Here, in FIG. 3, the frequency represented by the horizontal axis is normalized by local frequencies, and the gain represented by the vertical axis is normalized by the maximum value.

As described above, discrete time direct sampling circuit 1500 performs filter processing with the bandpass characteristic shown in FIG. 3 and acquires discrete time analog signals whose sampling frequency is decimated (punctured) to ⅙ of the local signal.

Patent Document 1: National Publication of International Patent Application No. 2003-510933

DISCLOSURE OF INVENTION

Problem to be Solved by the Invention

However, the conventional technique has the following problems.

In the conventional discrete time direct sampling circuit shown in FIG. 1, for example, if the duration of time for integration and charging is made longer and the order of the FIR filter characteristic is increased, it is possible to allow to pass only a narrower bandwidth of an input signal compared to a local signal and attenuate the output of the signal greatly outside the narrowband. By this means, although it is possible to realize a narrowband frequency response characteristic, the sampling rate of the discrete time analog signal becomes significantly lower due to decimation by a long period of integration. Therefore, the discrete time direct sampling circuit needs to be designed taking into account the influence of folding noise (i.e. aliasing) in the later stages, which limits the flexibility in design. To prevent reduction of a sampling rate, Patent Document 1 discloses providing circuits for sampling, performing integration and charging in a plurality of parallel systems. Here, by sequentially shifting the timing of integration and reading between the systems, it is possible to prevent the reduction of the sampling rate. However, if this configuration is employed, there is a trade-off problem that the circuit scale becomes larger in proportion to the number of parallel systems.

Also, to ensure a greater amount of attenuation in the blocking band, a method of weighting amplitudes in the period to perform integration and charge is possible as disclosed in, for example, Patent Document 1, but there is a problem that the method has a difficulty in performing weighting at high accuracy within a practical range.

It is therefore an object of the present invention to provide a direct sampling circuit and receiver that provides a filter effect with a steep attenuation characteristic in a narrow pass band without lowering the sampling rate significantly, by adopting discrete time analog processing.

Means for Solving the Problem

To solve the above-described problems, the discreet time direct sampling circuit and receiver employs a configuration having: a first differential voltage-to-current convertor that converts an analog radio frequency signal input to differential analog radio frequency current signals, at a first predetermined voltage-to-current conversion rate; a positive-phase sampling mixer that samples a positive-phase analog radio frequency current signal outputted from the first differential voltage-to-current convertor by a first sampling signal that is based on a local signal, and outputs the sampled signal at a timing in accordance with a first read control signal that is based on the local signal; a negative-phase delay sampling mixer that samples a negative-phase analog radio frequency current signal outputted from the first differential voltage-to-current convertor, by a second sampling signal that is based on the local signal, and outputs the sampled signal at a timing in accordance with a second read control signal that is delayed to the timing in accordance with the first read control signal by a predetermined sample timing; and a combining output section that combines a sampling value read out from the positive-phase sampling mixer and a sampling value read out from the negative-phase delay sampling mixer and outputs the combined value.

Advantageous Effect of Invention

According to the present invention, it is possible to suppress a decrease of the sampling rate without enlarging a circuit scale unlike a parallel configuration, and realize a filter characteristic with a steep attenuation characteristic in a narrow pass band. Further, it is possible to realize a filter frequency response characteristic of high order and high accuracy, with a relatively simple circuit configuration.

BEST MODE FOR CARRYING OUT THE INVENTION

Embodiments of the present invention will be explained below in detail with reference to the accompanying drawings.

Embodiment 1

With the present embodiment, in a discrete time direct sampling circuit and receiver, the configuration and operation example of a circuit will be explained, which performs discrete time analog processing of applying an input signal to differential voltage-to-current conversion, combining the sampling results of a positive-phase signal and negative-phase signal at the time interval corresponding to a plurality of samples, and supplying the combined signal to a history capacitor. By employing this configuration, it is possible to achieve a filtering effect that is equivalent to the FIR filter characteristic over a long integration period, without lowering the sampling rate by decimation.

Figure 4:
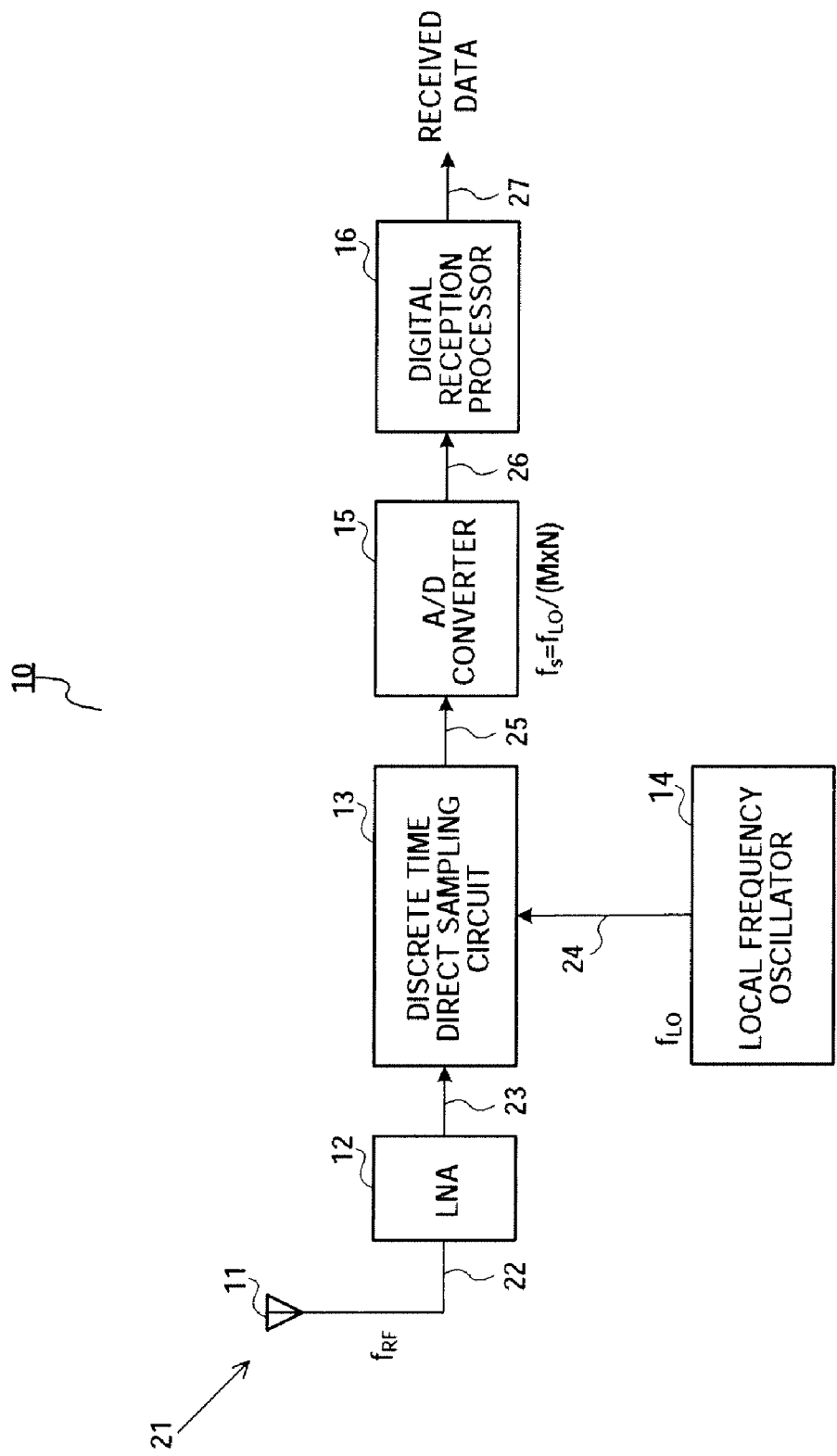
FIG. 4 is a diagram showing a configuration of a discrete time direct sampling receiver according to Embodiment 1 of the present invention.

FIG. 4 is a diagram showing the configuration of discrete time direct sampling receiver 10 used to explain the present embodiment. Discrete time direct sampling receiver 10 is provided with antenna 11, low noise amplifier (hereinafter "LNA") 12, discrete time direct sampling circuit 13, local frequency oscillator 14, analog-to-digital ("A/D") converter 15 and digital receiving processor 16. Discrete time direct sampling receiver 10 receives electromagnetic wave 21 transmitted by the carrier frequency $f_{RF}$, extracts the desired signal components by performing a frequency conversion and filtering processing in a discrete time manner, converts the signal into a digital signal, performs digital receiving processing of the converted digital signal, and outputs resulting received data 27.

Antenna 11 receives electromagnetic wave 21 transmitted from a transmitting station (not shown) by the carrier frequency $f_{RF}$ and transforms it into analog RF signal 22.

Low noise amplifier 12 amplifies and outputs analog RF signal 22.

Discrete time direct sampling circuit 13 receives as input amplified analog RF signal 23 and local frequency signal 24, performs frequency conversion and filter processing for analog RF signal 23 in a discrete time manner, and outputs baseband signal 25 comprised of only the extracted, desired signal components.

Local frequency oscillator 14 generates and outputs local frequency signal 24 used for sampling and frequency conversion processing, to discrete time direct sampling circuit 13.

Analog-to-digital converter 15 quantizes baseband signal 25 received as input, to digital values by a predetermined sampling frequency, and outputs converted digital baseband signal 26.

Digital receiving processor 16 performs predetermined digital receiving processing including demodulation processing and decoding processing, using digital baseband signal 26 received as input, and outputs resulting received data 27.

Figure 5:
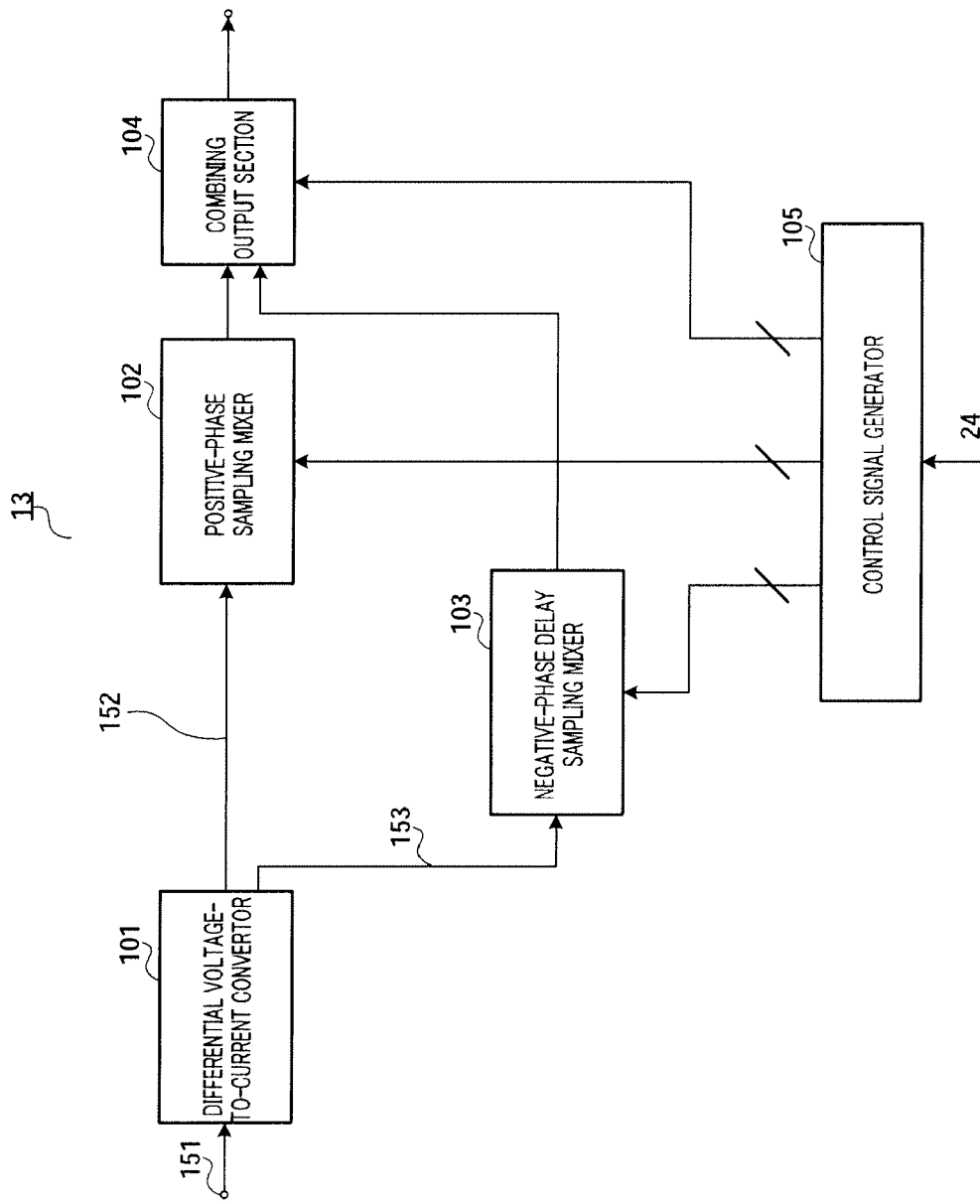
FIG. 5 is a diagram showing a function block configuration of a discrete time direct sampling circuit according to Embodiment 1 of the present invention.
Figure 6:
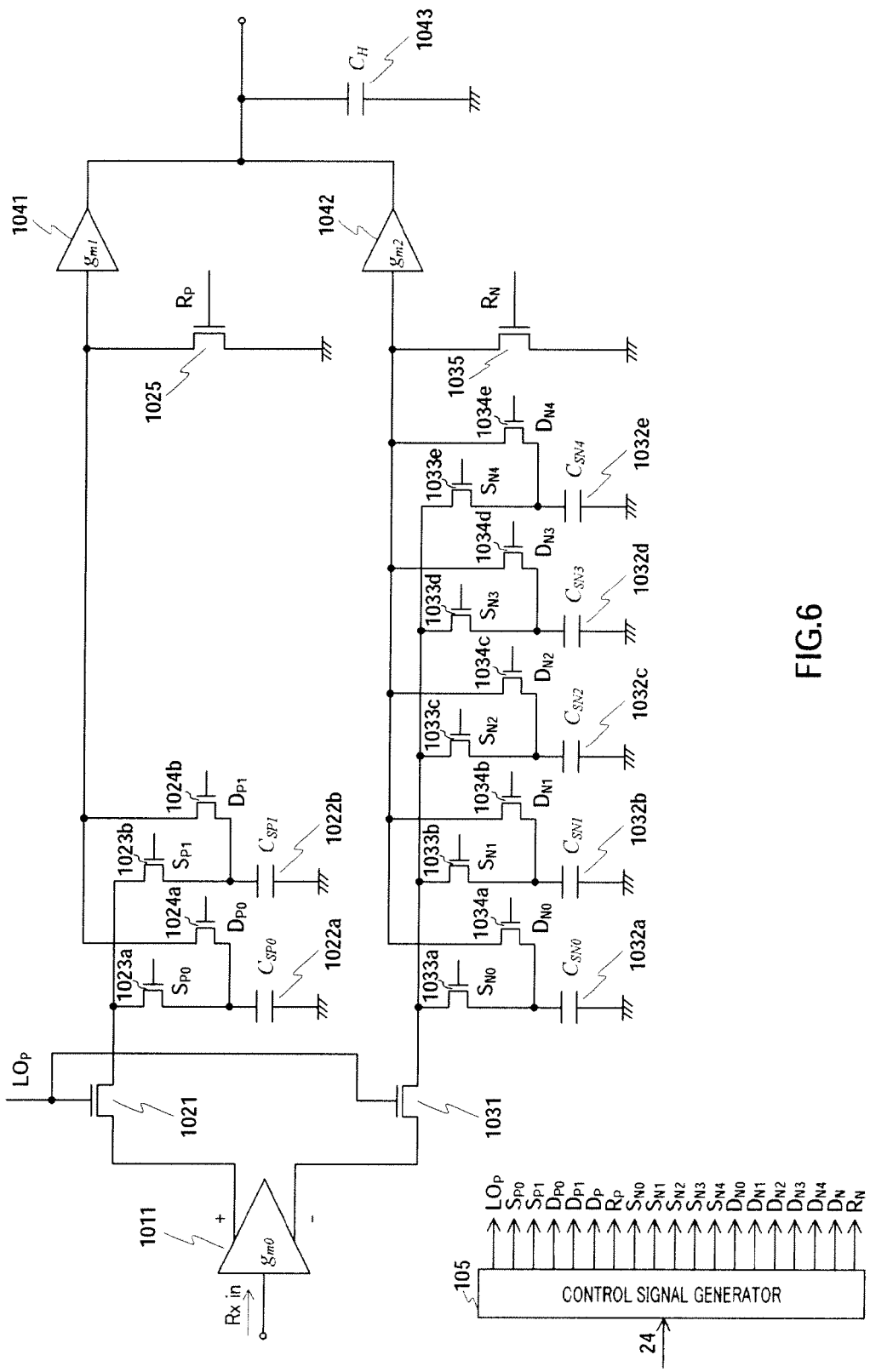
FIG. 6 is a diagram showing a circuit configuration example of a discrete time direct sampling circuit according to Embodiment 1 of the present invention.

FIG. 5 is a diagram showing the function block configuration of discrete time direct sampling circuit 13 in discrete time direct sampling receiver 10 shown in FIG. 4. Discrete time direct sampling circuit 13 is provided with differential voltage-to-current convertor 101, positive-phase sampling mixer 102, negative-phase delay sampling mixer 103, combining output section 104 and control signal generator 105. Also, FIG. 6 illustrates an example of the circuit configuration of the components shown in FIG. 5, in detail.

In FIG. 5, differential voltage-to-current convertor 101 converts radio frequency ("RF") received signal 151 received as input, into differential current signals, and outputs positive-phase analog RF current signal 152 and negative-phase analog RF current signal 153. Here, the voltage-to-current conversion rate (i.e. transconductance) in differential voltage-to-current convertor 101 is $g_{m0}$.

Positive-phase sampling mixer 102 samples positive-phase analog RF current signal 152 received as input, according to a positive-phase local signal, and reads out the sampled signal at a predetermined read timing. For example, as shown in FIG. 6, positive-phase sampling mixer 102 is formed with: mixer switch 1021 that is driven by positive-phase local signal $LO_P$; electric charge sampling capacitors 1022a and 1022b of two systems; sampling switches 1023a and 1023b of two sequences that control the connection with mixer switch 1021; read switches 1024a and 1024b for selectively reading out voltages proportional to the amounts of electric charges held in electric charge sampling capacitors 1022a and 1022b in later stages; and control switch 1025 for earthing and resetting the electric charges held in the electric charge sampling capacitors. In the following, the block formed with electric charge sampling capacitor 1022, and sampling switch 1023 and read switch 1024 connected to electric charge sampling capacitor 1022, is referred to as a "sampling tap." Although positive-phase sampling mixer 102 according to the present embodiment has two sampling taps, this is only an example, and the number of sampling taps is determined by the filter characteristic to be realized. Here, sampling switch 1023 and read switch 1024 included in the same sampling tap do not turn "on" at the same timing.

Negative-phase delay sampling mixer 103 samples negative-phase analog RF current signal 153 received as input, according to the positive-phase local signal, and reads out the sampled signal at a predetermined read timing. For example, as shown in FIG. 6, negative-phase delay sampling mixer 103 is provided with: mixer switch 1031 that is driven by positive-phase local signal $LO_P$; five systems of sampling taps; and control switch 1035 for earthing and resetting the electric charges held in the electric charge sampling capacitors. Here, each sampling tap is provided with: electric charge sampling capacitor 1032 (a to e), sampling switch 1033 (a to e) that controls connection with mixer switch 1031; and read switch 1034 (a to e) for selectively reading out a voltage proportional to the amount of electric charges held in electric charge sampling capacitor 1032 (a toe) in a later stage. Here, five sampling taps are provided because the present embodiment shows an example case of holding five signal samples, and the number of sampling taps is determined by the filter characteristic to be realized. Here, sampling switch 1033 and read switch 1034 included in the same sampling tap do not turn on at the same timing.

Combining output section 104 combines the signals sampled in positive-phase sampling mixer 102 and negative-phase delay sampling mixer 103, and combines the resulting signal with signals accumulated in the past. For example, as shown in FIG. 6, combining output section 104 is provided with: voltage-to-current convertor 1041 that converts a signal voltage read out from positive sampling mixer 102 into a current at a predetermined conversion rate $g_{m1}$ and outputs the current; voltage-to-current convertor 1042 that converts signal voltages proportional to the amounts of electric charges held in the electric charge sampling capacitors in negative-phase delay sampling mixer 103, into currents at a predetermined conversion rate $g_{m2}$, and that outputs the currents; and history capacitor 1043 that combines electric charges supplied from voltage-to-current convertors 1041 and 1042 with electric charges accumulated in the past.

Control signal generator 105 generates control signals required in positive-phase sampling mixer 102, negative-phase delay sampling mixer 103 and combining output section 104, based on local signal 24 supplied from local frequency oscillator 14. In FIG. 5, these control signals are represented by three arrows extending upward from control signal generator 105. Using the configuration of FIG. 6 to explain these control signals, a control signal is outputted from control signal generator 105 (e.g. $LO_P$) to the element represented by the same reference symbol in discrete time direct sampling circuit 13 in FIG. 6. Control signal generator 105 outputs positive-phase local signal $LO_P$, control signals $S_{P0}$, $S_{P1}$, and $S_{N0}$ to $S_{N4}$ for the electric charge sampling switches, control signals $D_{P0}$, $D_{P1}$ and $D_{N0}$ to $D_{N4}$ for the read switches, and control signals $R_P$ and $R_N$ for the reset switches.

Figure 7:
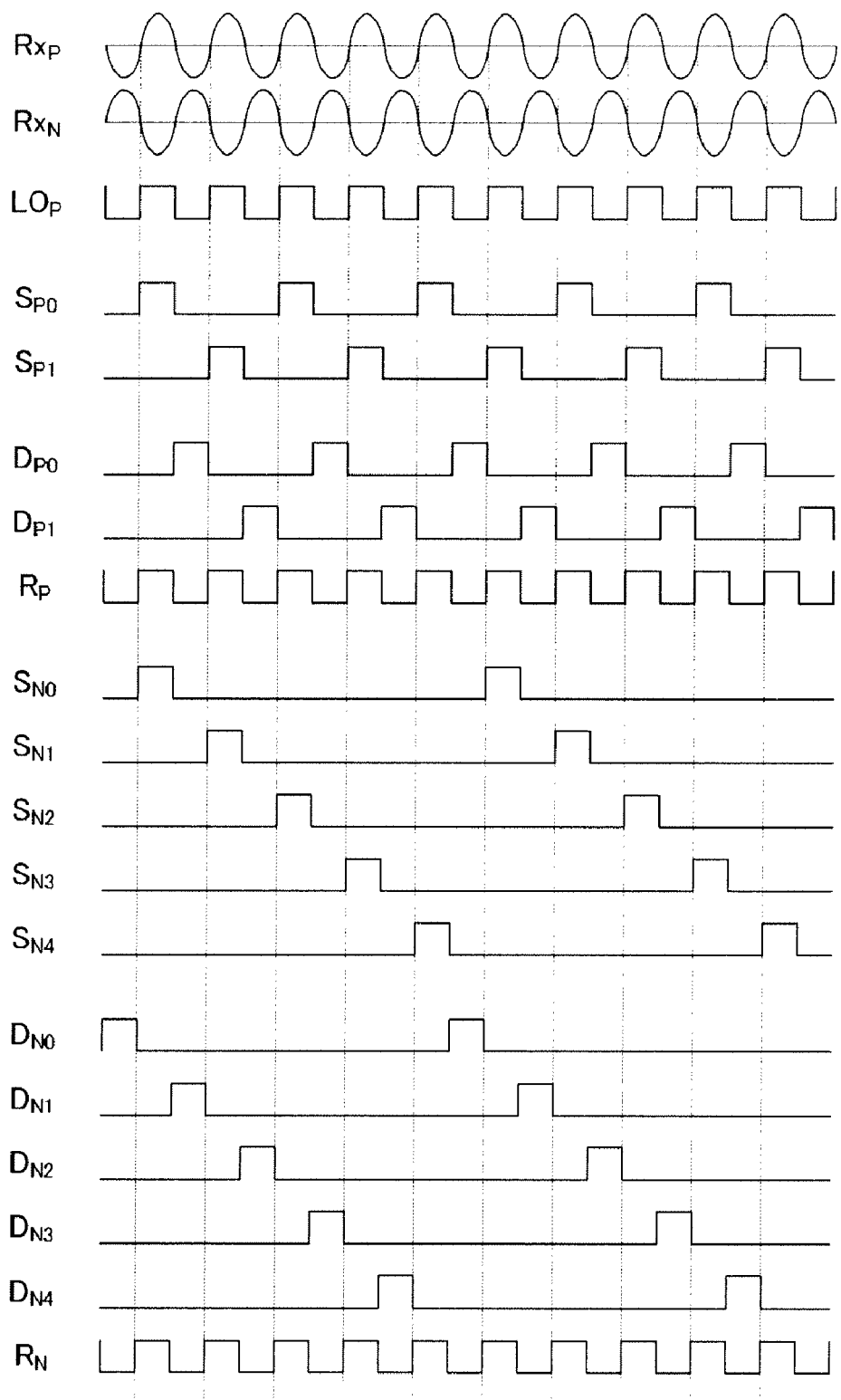
FIG. 7 is a diagram showing an example of a timing chart of control signals according to Embodiment 1 of the present invention.

FIG. 7 is a timing chart of control signals outputted from control signal generator 105. Details of this will be described later with explanation of the circuit operations.

In the above-described configuration, assume that the capacitance is the same between all of electric charge sampling capacitors 1022a and 1022b in positive-phase sampling mixer 102, and electric sampling capacitors 1032a to 1032e in negative-phase delay sampling mixer 103, and the value is the same between voltage-to-current conversion rates $g_{m1}$ and $g_{m2}$ in voltage-to-current convertors 1041 and 1042.

The operations of discrete time direct sampling receiver 10 and discrete time direct sampling circuit 13 formed as above, will be explained below.

Electromagnetic wave 21 transmitted from a transmitting station (not shown in FIG. 4) by the carrier frequency $f_{RF}$ is converted in antenna 11 from an electromagnetic wave to analog RF signal 22, and this analog RF signal 22 is amplified in low noise amplifier ("LNA") 12. Amplified analog RF signal 23 is sampled in a discrete time manner using local frequency signal 24 in discrete time direct sampling circuit 13, and is frequency-converted to a signal of the baseband frequency band. Then, the desired signal components are extracted through discrete time filter processing, and baseband signal 25 is outputted. Resulting baseband signal 25 is quantized into digital values by analog-to-digital converter 15 and subjected to predetermined receiving processing including demodulating processing and decoding processing in digital receiving processor 16, and received data 27 is outputted.

Next, discrete time direct sampling circuit 13 will be explained using FIG. 5. In discrete time direct sampling circuit 13, analog RF received signal 151 received as input is converted to differential current signals in differential voltage-to-current convertor 101, and positive-phase analog RF current signal 152 is supplied to positive-phase sampling mixer 102 and negative-phase analog RF current signal 153 is supplied to negative-phase delay sampling mixer 103.

Processing in positive-phase sampling mixer 102 and negative-phase delay sampling mixer 103 will be explained using FIG. 6. Positive-phase analog RF current signals received as input in positive-phase sampling mixer 102 are supplied to and charged in one of electric charge sampling capacitors $C_{SP0}$ (1022a) and $C_{SP1}$ (1022b), over the period mixer switch 1021 is turned "on" by positive-phase local signal $LO_P$. Which sampling capacitor is charged is determined based on the timings of control signals $S_{P0}$ and $S_{P1}$ supplied to sampling switches 1023a and 1023b, respectively.

Also, negative-phase analog RF current signals received as input in negative-phase delay sampling mixer 103 are supplied to and charged in one of the electric charge sampling capacitors, over the period mixer switch 1031 is turned "on" by positive-phase local signal $LO_P$. Which electric charge sampling capacitors $C_{SN0}$ (1032a) to $C_{SN4}$ (1032e) is charged is determined based on the timings control signals $S_{N0}$ to $S_{N4}$ supplied to sampling switches 1033a to 1033e are turned "on."

It is generally known that, performing charge integration of analog RF current signals received as input over a period corresponding to a half cycle of a local signal in positive-phase sampling mixer 102 and negative-phase delay sampling mixer 103, equals performing filter processing having a so-called lowpass characteristic resembling a SINC function in effect.

Explanation will be provided below using the control signals in the timing chart shown in FIG. 7. In positive-phase sampling mixer 102, two systems of electric charge sampling capacitors $C_{SP0}$ and $C_{SP1}$ are charged, alternately, on a sample-by-sample basis. At the same timing positive-phase local signal $LO_P$ becomes low, one of read switch 1024a and read switch 1024b charged immediately before $LO_P$ becomes low is turned "on," so that the sample value in an electric charge sampling capacitor that was charged immediately before, is read out (that is, the electric charge charged in the electric charge sampling capacitor is released). Here, positive-phase sampling mixer 102 has two pairs of sampling taps, and therefore pulses of $S_{P0}$ and $S_{P1}$ occur at a frequency half local signal LO. Further, the phases of $S_{P0}$ and $S_{P1}$ are shifted by one period of the local signal. With this configuration, the voltages proportional to the amounts of electric charges held in sampling capacitor $C_{SP0}$ or sampling capacitor $C_{SP1}$, alternately on a per sample-by-sample basis, are read out. After that, at a timing immediately after a voltage is read out, reset switch 1025 is turned "on," and thereupon the electric charge that is charged is reset.

By contrast with this, in negative-phase delay sampling mixer 103, five systems of electric charge sampling capacitors 1033a to 1033e are charged at timings varying one sample each. Here, negative-phase delay sampling mixer 103 has five pairs of sampling taps, and therefore pulses of $S_{N0}$ to $S_{N4}$ occur at a frequency one-fifth of the frequency of local signal LO. Further, $S_{N0}$ to $S_{N4}$ have phases that vary one local signal period each. On the other hand, immediately after positive-phase local signal $LO_P$ becomes low, read switch 1034 in the sampling tap charged four $LO_P$ clocks earlier is turned "on" (here, control signals $D_{n0}$ to $D_{n4}$ are applied to switches 1034a to 1034e), so that the sample values in the electric charge sampling capacitor charged four samples earlier, that is, voltages proportional to the amounts of held electric charges are read out in order. Then, at a timing immediately after a voltage is read out, reset switch 1035 is turned "on," and thereupon an electric charge that is charged is reset.

Thus, five sampling taps in negative-phase delay sampling mixer 103 can release a negative-phase analog RF current signal that was integrated before the integration period in which a positive-phase analog RF current signal released from positive phase sampling mixer 102 was integrated, such that the period to release a negative-phase analog RF current signal integrated in an arbitrary negative sampling tap and the period to integrate a negative-phase analog RF current signal in another negative-phase sampling tap, are synchronized (with a delay of the half period of $LO_P$ in FIG. 7), and that the release periods of five sampling taps in negative-phase delay sampling mixer 102 and the release periods of two sampling taps in positive-phase sampling mixer 102 are synchronized (at the same timing in FIG. 7). Here, although the period to release a negative-phase analog RF current signal integrated in an arbitrary negative-phase sampling tap and the period to integrate a negative-phase analog RF current signal in another negative-phase sampling tap are synchronized with a shift of half the period of $LO_P$, these periods may overlap partly or fully.

In combining output section 104, with the above-described control operations, voltages that are read out with a delay of four samples between the positive-phase side and the negative-phase side are converted back to currents in voltage-to-current convertors 1041 and 1042, and added and combined with electric charges held in the past. Upon combination, the negative-phase sample current is combined using an opposite sign to the positive-phase current. This combination is performed based on control signals $D_{P0}$ and $D_{P1}$, and therefore the sampling frequency is not decimated and is the same as a local frequency. Therefore, it is possible to read out a discrete time analog signal in the same sampling frequency as a local frequency in later stages.

The operations of the sampling and combination as described above are represented by the transfer function of equation 1, providing a filtering effect that is equivalent to the third-order FIR characteristic.

(Equation 1)

$$H(z) = \frac{1-z^{-4}}{1-z^{-1}} = 1 + z^{-1} + z^{-2} + z^{-3} \quad [1]$$

Figure 8:
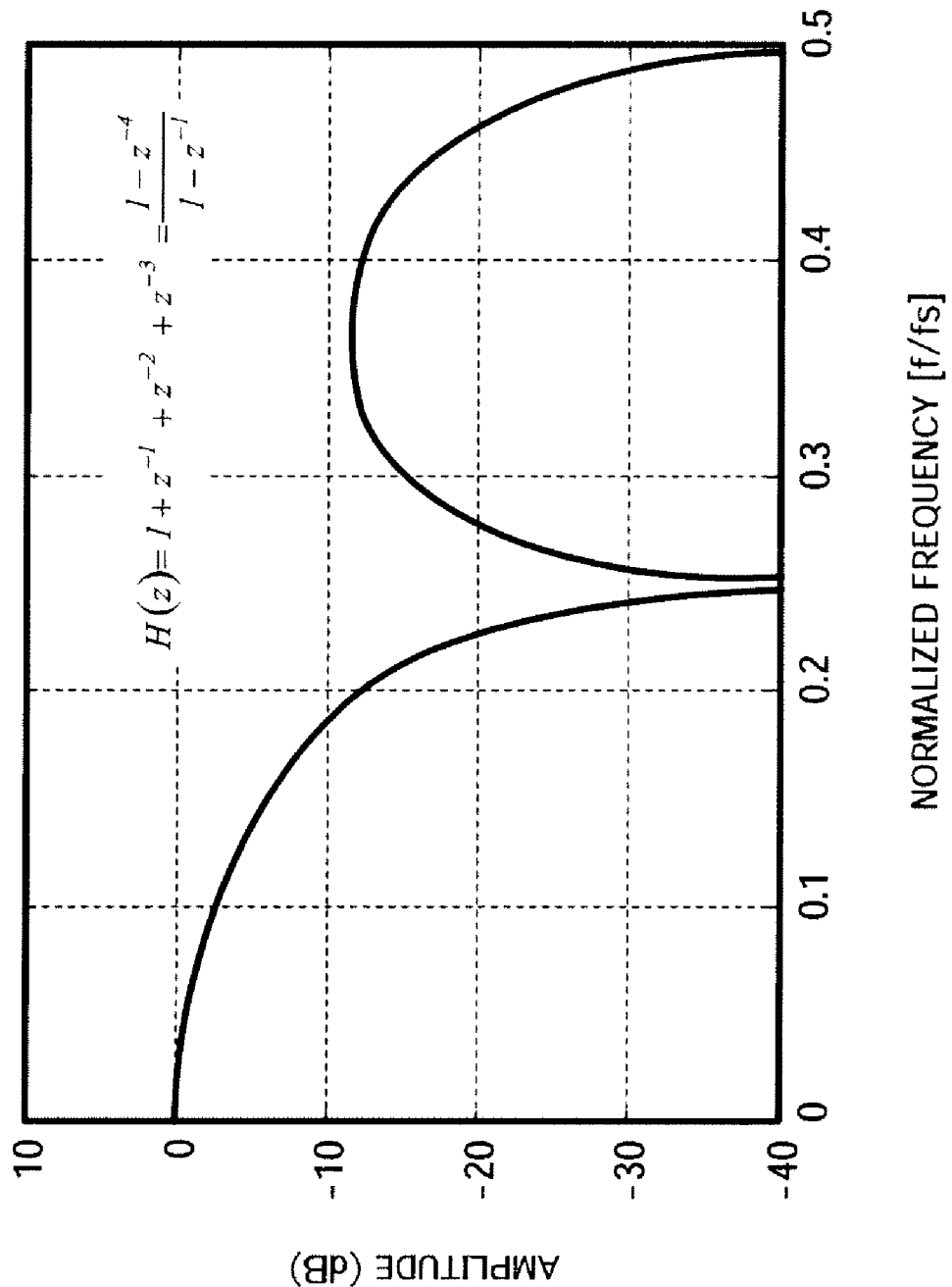
FIG. 8 is a diagram showing an example of a filter characteristic realized in Embodiment 1 of the present invention.

FIG. 8 illustrates the filter characteristic of the transfer function represented by equation 1 in discrete time direct sampling circuit 13. The horizontal axis represents a frequency from a local frequency upon normalizing the local frequency by "1." Further, in FIG. 8, the maximum gain is normalized by 0 dB. Further, equation 1 and FIG. 8 do not take into account the lowpass filter characteristic resembling a SINC function acquired by integrating an input current over the half period of the local signal cycle.

Thus, the configuration and operations of the present embodiment make it possible to sample an analog RF signal that is received by a local frequency and apply filter processing of a high-order FIR characteristic, thereby outputting signals without lowering the sampling rate and making possible a filter characteristic of a steeper attenuation characteristic in a narrower pass band.

Also, although an example has been described above with the present embodiment where a filter characteristic equivalent to a third-order FIR filter is acquired by a configuration to hold five electric charge samples in a negative-phase delay sampling mixer, the present invention is not limited to this configuration. For example, by making the number of sampling taps in the negative-phase delay sampling mixer N (N is a natural number), it is possible to a design an enhanced FIR characteristic of a (N−2)-th order.

Also, although an example of the configuration and operations for a case where a discrete time analog signal is outputted without decimation at the same sampling rate as the local frequency has been described with the present embodiment, the present invention is not limited to this, and it is equally possible to employ a configuration and operations to output a discrete time analog signal at a lower sampling rate by decimating the reading timing in comparison to the rate of the local frequency.

Also, in the present embodiment, although the capacitance is the same between all of electric charge sampling capacitors 1022a and 1022b in positive-phase sampling mixer 102 and electric charge sampling capacitors 1032a to 1033e in negative-phase sampling mixer 103, and the value is the same between voltage-to-current conversion rates $g_{m1}$ and $g_{m2}$ in voltage-to-current convertors 1041 and 1042, the present invention is not limited to this. The essential requirement is to employ a configuration in which, for an arbitrary signal input amplitude, electric charge sampling capacitors are charged, voltages read out in voltage-to-current convertors are converted back to currents, and the amount of electric charges supplied to history capacitor 1043 is the same between the positive-phase side and the negative-phase side. That is, for a certain signal amplitude, the amount of electric charges supplied from the positive-phase side and the amount of electric charges supplied from the negative-phase side are the same in the history capacitor That is, the essential requirement is to employ a configuration in which the ratio between capacitor capacitance $C_{SP}$ and voltage-to-current conversion rate $g_{m1}$ on the positive-phase side is the same as the ratio between capacitor capacitance $C_{NP}$ and voltage-to-current conversion rate $g_{m2}$ on the negative-phase side.

Further, taking into account the influence of the variations of element characteristics upon manufacturing, it is possible to employ a configuration in which the capacitances of electric charge sampling capacitors 1022 and 1032, and the $g_m$ value of one of voltage-to-current convertors 1041 and 1042 can be subject to variable control and absorb the influence of the variations by adjustment of the variable control. Also, if the characteristics of switches and capacitors in an implemented circuit are not ideal and the circuit has a limited impedance and parasitic capacity, held electric charges are anticipated to be leaked by these influences. In this case, the amount of electric charge leakage is anticipated to increase, and, consequently, it may be possible to employ a configuration setting a higher voltage-to-current conversion rate in voltage-to-current convertor 1042 on the negative-phase side taking into account that amount of leakage.

Figure 1:
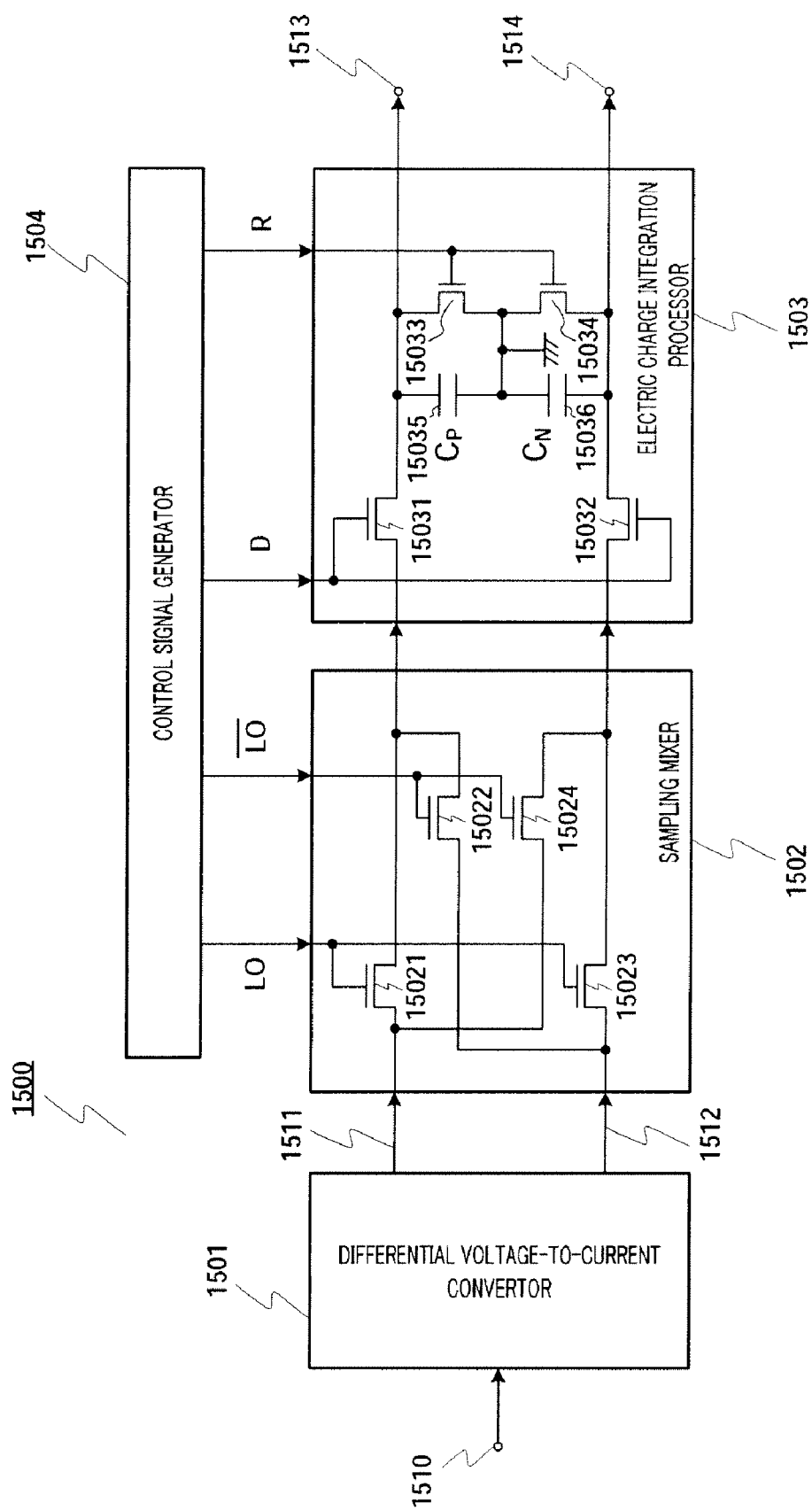
FIG. 1 is diagram showing a configuration example of a conventional discrete time direct sampling circuit.
Figure 2:
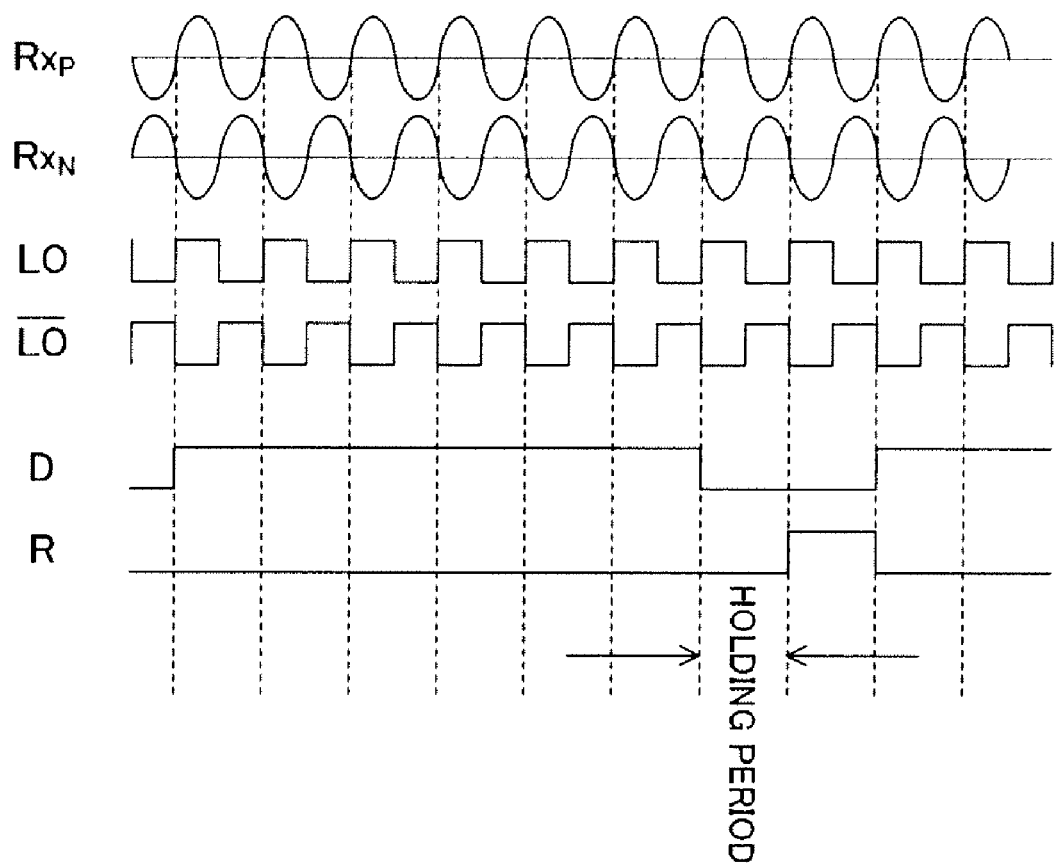
FIG. 2 is a diagram showing an example of a timing chart of a control signal in a conventional discrete time direct sampling circuit.
Figure 3:
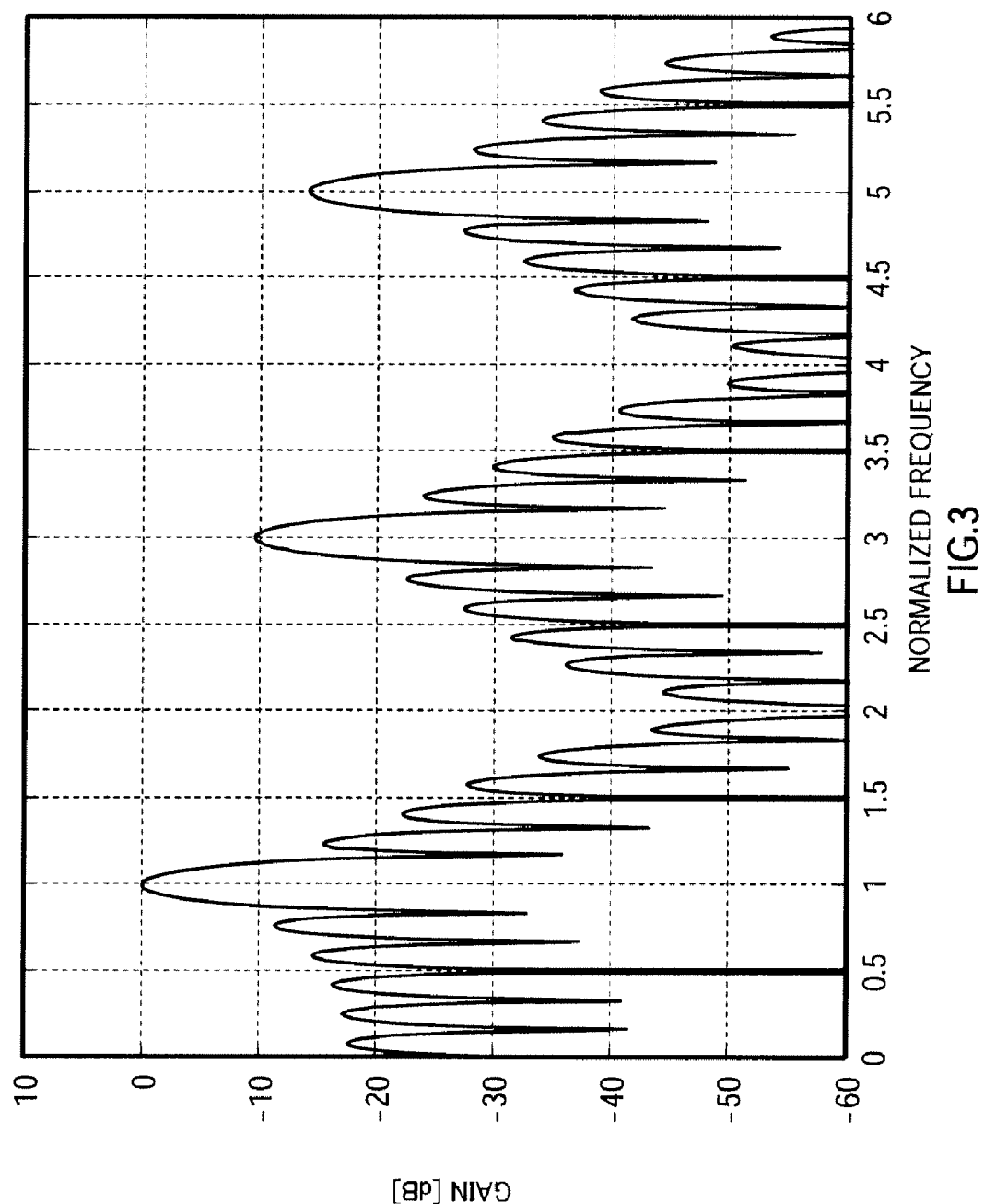
FIG. 3 is a diagram showing an example of a filter characteristic realized by a conventional discrete time direct sampling circuit.
Figure 9:
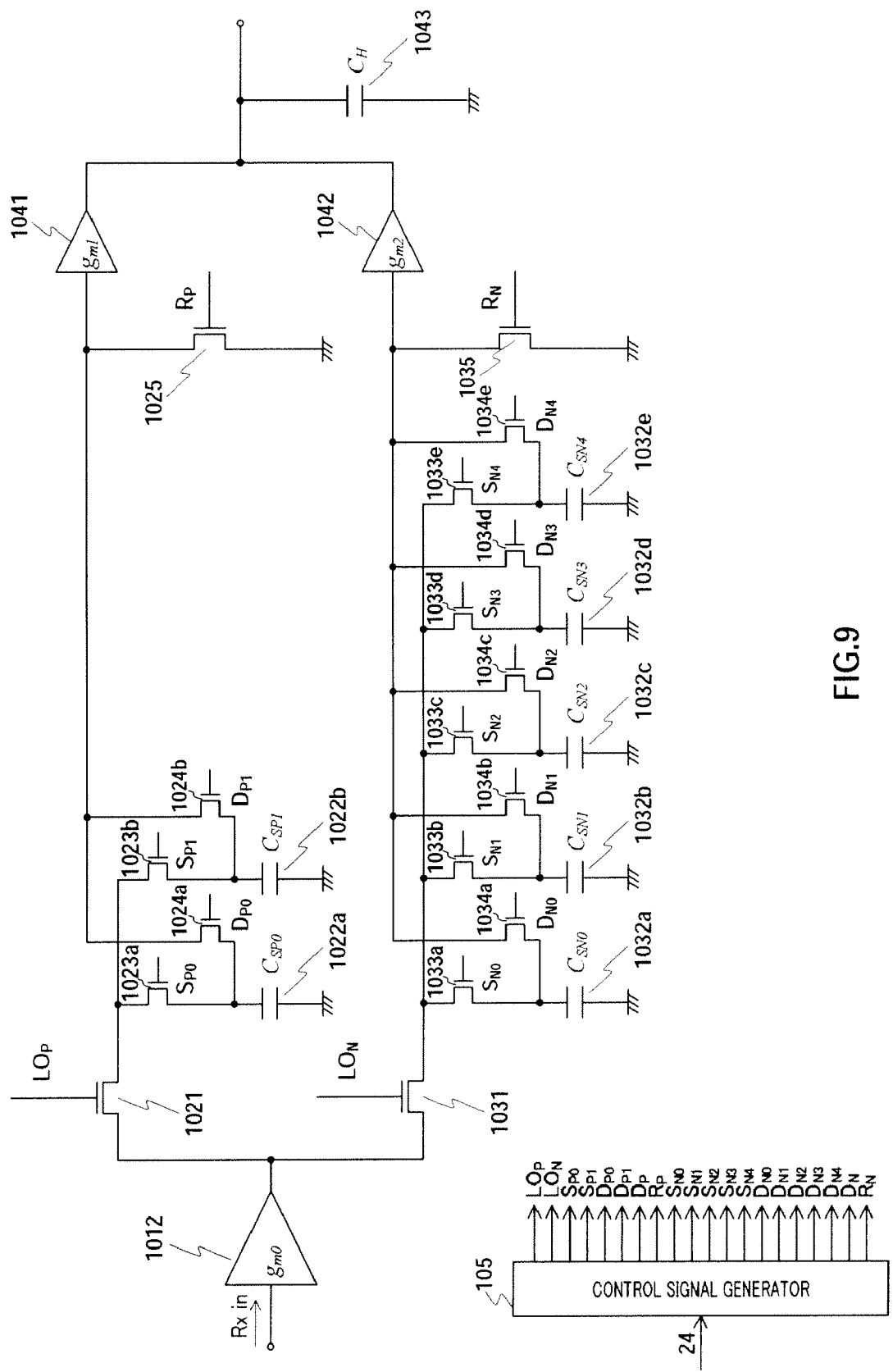
FIG. 9 is a diagram showing a circuit configuration example of a discrete time direct sampling circuit according to Embodiment 1 of the present invention.
Figure 10:
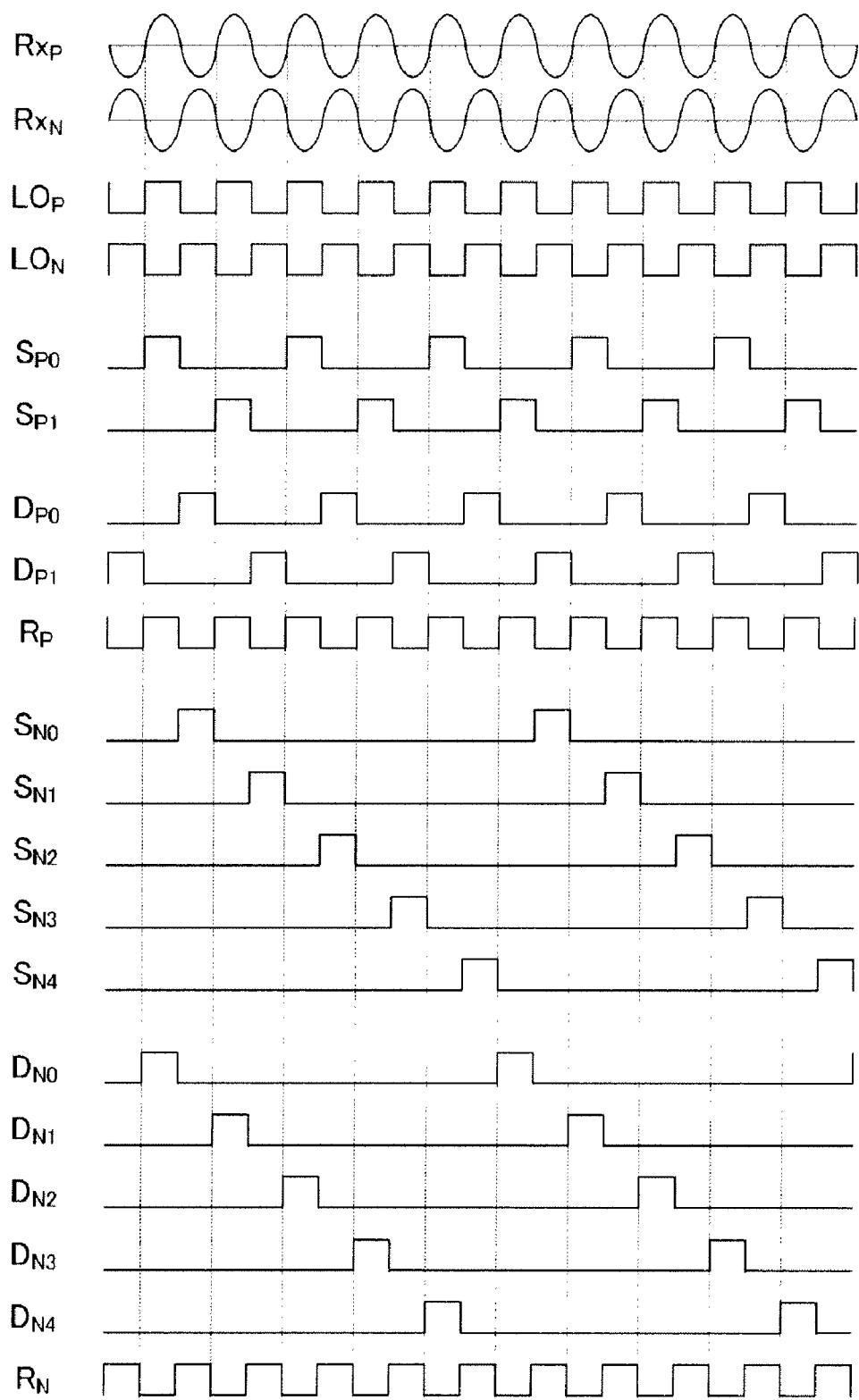
FIG. 10 is a diagram showing an example of a timing chart of control signals according to Embodiment 1 of the present invention.

Also, in the configuration shown in FIG. 6, although a case has been described above with the present embodiment where single-phase signals are outputted to later stages for ease of explanation, the present invention is not limited to this configuration. For example, it is possible to change the configuration of FIG. 6 based on the configuration to perform differential inputs and differential outputs as shown in FIG. 1, thereby realizing differential outputs. Also, although signals acquired by applying differential voltage-to-current conversion to an analog RF input are used in the configuration shown in FIG. 6, the present invention is not limited to this, and it is equally possible to employ a configuration using, for example, a single-phase voltage-to-current convertor. In this case, as shown in FIG. 9, a configuration may be employed in which the output of single-phase voltage-to-current convertor 1012 is outputted to both positive-phase sampling mixer 102 and negative-phase delay sampling mixer 103, to sample the output by positive-phase local signal $LO_P$ in positive-phase sampling mixer 102 and sample the output by negative-phase local signal $LO_N$ in negative-phase delay sampling mixer 103. The timing chart in this case is as shown in FIG. 10.

Figure 11:
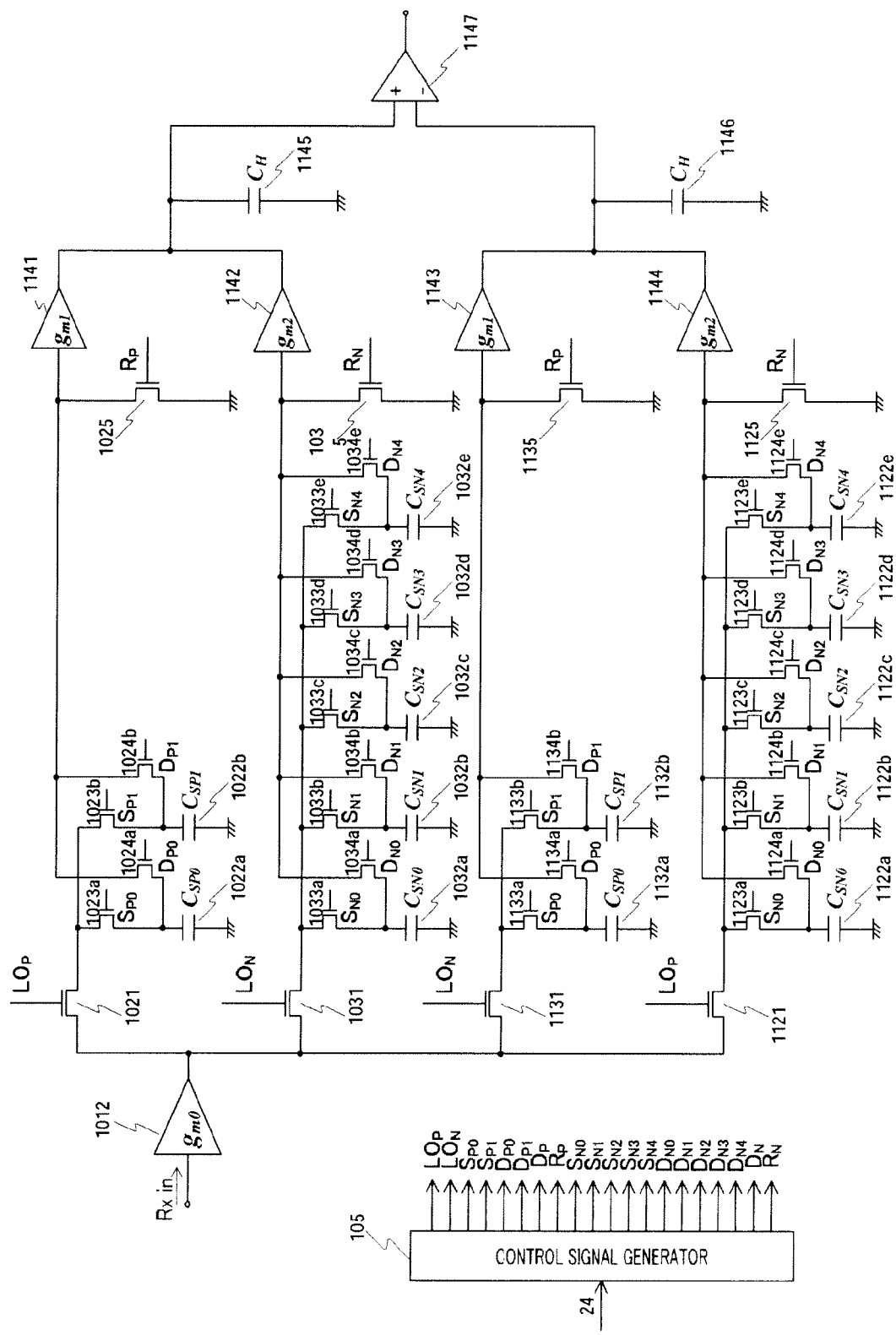
FIG. 11 is a diagram showing another circuit configuration example of a discrete time direct sampling circuit according to Embodiment 1 of the present invention.

Further, in the configuration shown in FIG. 9, it is possible to further provide the same configurations as positive-phase sampling mixer 102 and negative-phase delay sampling mixer 103, in parallel, on a per system basis (see FIG. 11). That is, it is possible to employ a configuration in which, by supplying negative-phase local signal $LO_N$ to system 113, which has the same configuration as positive-phase sampling mixer 102, to become a negative-phase sampling system, by supplying positive-phase local signal $LO_P$ to system 112, which has the same configuration as negative-phase delay sampling mixer 103, to become a positive-phase delay sampling system, and by setting combining output section 114 that combines the outputs of these two systems 112 and 113, signals having a differential relationship are outputted from combining output section 104 and combining output section 114.

Also, in the time chart shown in FIG. 7, it is needless to say that it is possible to divide and supply a common control signal for control signals assigned the same timing. Also, although a configuration has been described above where a positive-phase local signal is generated in control signal generator 105, the present invention is not limited to this, and it is equally possible to employ a configuration in which a signal supplied from local frequency oscillator 14 is directly supplied to mixer switches.

Also, as show in FIG. 6, although a configuration has been described above with the present embodiment as a configuration example of combining output section 104 where the voltages proportional to the amounts of electric charges accumulated in electric charge sampling capacitors are converted to currents in voltage-to-current convertors 1041 and 1042 over a predetermined time period and charged in history capacitor 1043, the present invention is not limited to this. For example, it is possible to employ a configuration in which: voltage-to-current convertors 1041 and 1042 are replaced with buffer configurations such as emitter followers for reading out voltages; a voltage adder is provided instead of a history capacitor to combine the voltages; and an analog-to-digital convertor is provided to perform digital quantization and add the resulting digital data and the data of the previous sample.

Also, it is needless to say that, if the operations are substantially equivalent to the features of the present embodiment, the configuration and details of control may vary within the range that can be attained by a skilled person. For example, it is possible to employ a configuration to make the duration of time that allows a switch to turn on by a control signal long or short as appropriate, and, if the configuration is replaced to provide margins between control signals with a configuration to provide an extra number of sampling taps comprised of electric charge sampling capacitors and switches, it does not influence the essence of the present invention. Also, if the number of sampling taps is reversed between the positive-phase side and the negative-phase side, the essence of the present invention does not vary.

Embodiment 2

The present embodiment shows a case of realizing weighting of tap coefficients for a transfer function representing filter characteristics by adding a plurality of voltage-to-current convertors of different voltage-to-current conversion ratios, mixer switches, capacitors and so on, to the configuration of the discrete time analog processing circuit shown in Embodiment 1. Further, the present embodiment will explain an example of a configuration, operations and filter characteristic to be realized upon performing an output with a decimation (i.e. puncturing) of the sampling rate of the output for the local signal frequency.

Figure 12:
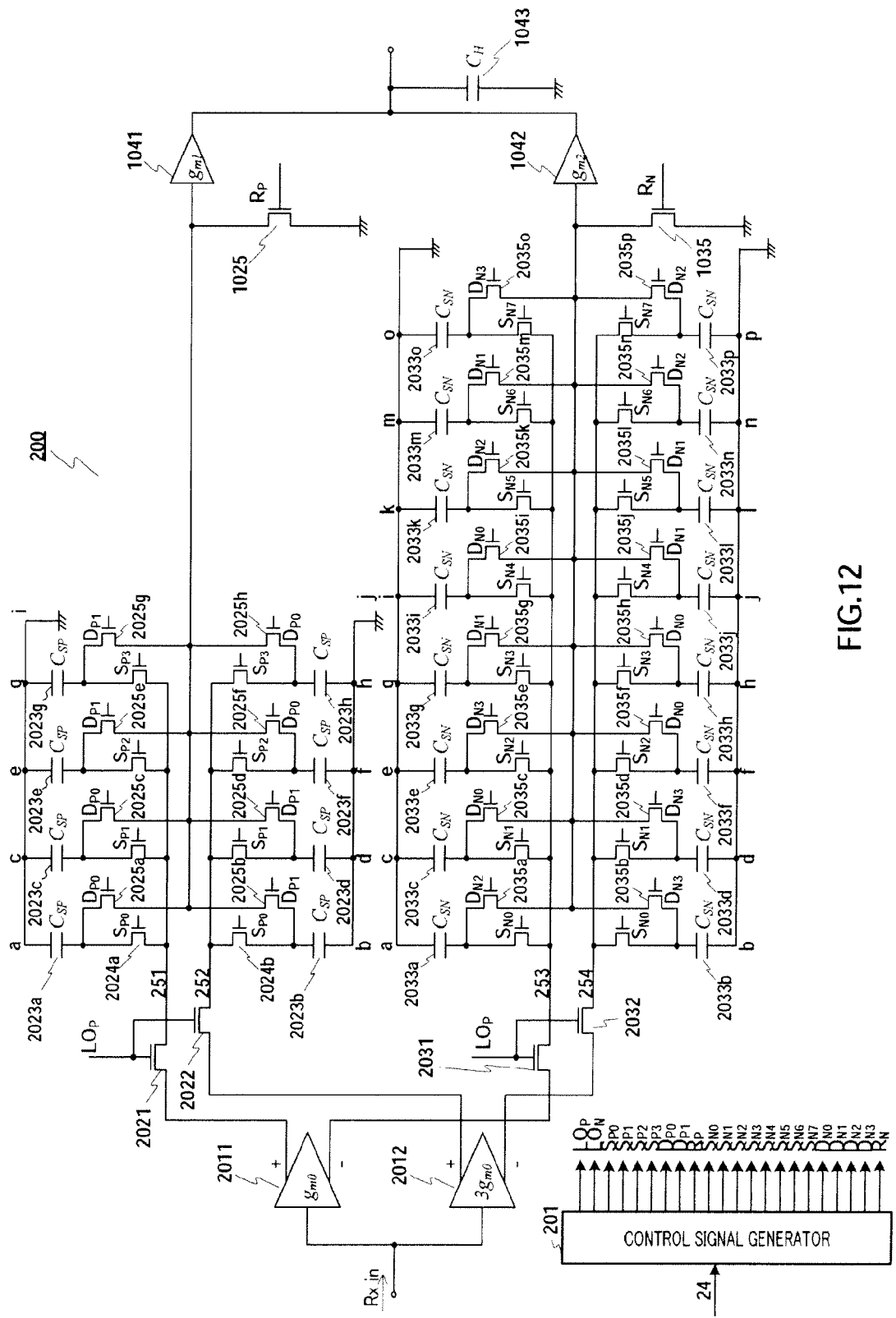
FIG. 12 is a diagram showing a circuit configuration example of a discrete time direct sampling circuit according to Embodiment 2 of the present invention.

FIG. 12 is a diagram showing the configuration of direct sampling circuit 200 used to explain the present embodiment. Direct sampling circuit 200 is provided with two differential voltage-to-current convertors 2011 and 2022 of different voltage-to-current conversion ratios in direct sampling circuit 13 shown in FIG. 6. Direct sampling circuit 200 is further provided with mixer switches 2021, 2022, 2031 and 2032 to sample the outputs of differential voltage-to-current convertors (2011 and 2022). Direct sampling circuit 200 is further provided with four sampling taps in the output stages of positive-phase mixer switches 2021 and 2022 of positive-phase systems, and eight sampling taps in the output stages of negative-phase mixer switches 2031 and 2032. Here, each sampling tap is comprised of an electric charge sampling capacitor, a sampling switch and a read switch. Direct sampling circuit 200 is further provided with control signal generator 201 that generates control signals to match these sampling taps. The configurations and operations of other components in FIG. 12 are the same as the components assigned the same reference numerals in FIG. 6, and therefore their explanation will be omitted.

Differential voltage-to-current convertors 2011 and 2012 convert analog RF signals received as input, to differential currents by a predetermined voltage-to-current conversion rate, and output the currents. Here, the transconductance value ($g_m$ value) in differential voltage-to-current convertor 201 is three times as high as that of differential voltage-to-current convertor 2011. That is, the transconductance value in differential voltage-to-current convertor 2011 is $g_{m0}$ and the transconductance value in differential voltage-to-current convertor 2012 is 3 $g_{m0}$. Positive-phase mixer switches 2021 and 2022 switch by local signals and allow positive-phase analog RF current signals outputted from differential voltage-to-current convertors 2011 and 2012 to pass when these switches are turned on. Negative-phase mixer switches 2031 and 2032 switch by local signals and allow negative-phase analog RF current signals outputted from differential voltage-to-current convertors 2011 and 2012 to pass when these switches are turned on.

The capacitances of electric charge sampling capacitors 2023$a$ to 2023$h$ in eight sampling taps in positive-phase sampling mixer 202 are all $C_{SP}$, and the capacitances of electric charge sampling capacitors 2033$a$ to 2033$p$ in sixteen sampling taps in negative-phase sampling mixer 203 are all $C_{SN}$.

In the sampling taps on the positive-phase side, the sampling switches and the control lines connected to the read switches are assigned codes of $S_{P0}$ to $S_{P2}$ and $D_{P0}$ to $D_{P1}$, respectively, and the same control signal is supplied to switches of the same code. In the sampling taps on the negative-phase side, the sampling switches and the control lines connected to the read switches are assigned the codes of $S_{N0}$ to $S_{N7}$ and $D_{N0}$ to $D_{N3}$, respectively, and the same control signal is supplied to the switches of the same code.

FIG. 12 illustrates a timing chart of control signals outputted from control signal generator 201 according to the present embodiment. This detail will be described later with explanation of the circuit operations.

Here, the capacitance $C_{SP}$ of the electric charge sampling capacitors in positive-phase sampling mixer 202 and the capacitance $C_{SN}$ of the electric charge sampling capacitors in negative-phase sampling mixer 203 are the same, and the voltage-to-current conversion rates $g_{m1}$ and $g_{m2}$ are the same to each other.

Also, as an example, the present embodiment provides a configuration and details of control assuming a case where the sampling rate at the stage signals are read out from a plurality of electric charge sampling capacitors and finally charged in a history capacitor, is decimated to half of the local frequency.

The operations of discrete time direct sampling circuit 200 formed as above will be explained below.

An analog RF signal that is received and amplified is converted to differential current signals in two differential voltage-to-current convertors 2011 and 2012 at respective voltage-to-current conversion ratios $g_{m0}$ and 3 $g_{m0}$. By this conversion, positive-phase analog RF current signals 251 and 252 and negative-phase analog RF current signals 253 and 254 are produced. In positive-phase sampling mixer 202, positive-phase analog RF current signals 251 and 252 are sampled in mixer switches 2021 and 2022, respectively, according to the timings of local signals.

According to control signals $S_{P0}$ to $S_{P3}$ supplied in four separate phases, the sampled electric charges are accumulated by shifting the timing every pair of two connected electric charge sampling capacitors. That is, in effect, two sampling taps comprised of the above-described pair of electric charge sampling capacitors form one positive-phase sampling tap. The period of the "on" state varies between two read switches 2025 (e.g. 2025$a$ and 2025$b$) included in this positive-phase sampling tap. Also, read switch 2025 (e.g. 2025$a$) included in the first positive-phase sampling tap and read switch 2025 (e.g. 2025$f$) included in the second positive-phase sampling tap are turned "on" in the same period.

By contrast, in negative-phase delay sampling mixer 203, negative-phase analog RF current signals 253 and 254 are sampled in mixer switches 2031 and 2032, respectively, according to the timings of local signals. According to control signals $S_{N0}$ to $S_{N7}$ supplied in eight phases, the sampled electric charges are accumulated by shifting the timing every pair of two connected electric charge sampling capacitors. That is, in effect, two sampling taps comprised of the above-described pair of electric charge sampling capacitors form one positive-phase sampling tap. The period of the "on" state varies between two read switches 2025 (e.g. 2025$a$ and 2025$b$) included in this positive-phase sampling tap. Also, read switch 2025 (e.g. 2025$a$) included in the first positive-phase sampling tap and read switch 2025 (e.g. 2025$f$) included in the second positive-phase sampling tap are turned "on" in the same period.

By charging the electric charge sampling capacitors this way, an electric charge matching the signal value of past four samples is accumulated on the positive-phase side, and an electric charge matching the signal value of past eight values is accumulated on the negative-phase side. Also, at each sample timing, two different electric charge signals are acquired with a ratio of 1:3 for the amounts of electric charges.

By contrast, on the side of read switches 2025 and 2035, among the signal values sampled at past sample timings and accumulated as above, electric charge signals accumulated in predetermined capacitors are selectively read out and combined, at timings of every two samples of the local signal frequency, according to six control signals of $D_{P0}$ and $D_{P1}$ and $D_{N0}$ to $D_{N3}$ shown in FIG. 12. For example, at the timing $D_{P0}$ becomes high on the positive-phase side, the electric charges held in electric charge sampling capacitors 2023a, 2023h, 2023f and 2023c are combined in a shared state. These capacitors accumulate the electric charges at the latest sample timing, the sample timing one sample earlier, the sample timing two samples earlier and the sample timing three samples earlier. Further, among these, the amount of electric charges accumulated in 2023f and 2023h is three fold compared to the other sample values, so that an equivalent effect as three-fold weighting and combination is provided. Similarly, at the timing $D_{N0}$ becomes high on the negative-phase side, the electric charge signals held in electric charge sampling capacitors 2033i, 2033h, 2033f and 2033c are combined in a shared state. These capacitors accumulate electric charges at the timing four samples earlier, the timing five samples earlier, the timing six samples earlier and the timing seven samples earlier. Further, among these capacitors, the amount of electric charges in capacitors 2033h and 2033f is three fold compared to the other sample values, so that an equivalent effect as three-fold weighting and combination is provided. The voltage value when electric charges selectively read out from a plurality of electric charge sampling capacitors by the above-described control operations, become a shared state and equilibrium state, is supplied to voltage value convertors 1041 and 1044 in later stages.

When the above-described operations are represented by a z function, this can be represented as shown in equation 2, providing a characteristic that is equivalent to the characteristic of two-stage connection of first-order FIR response or the characteristic of cascade connection of third-order FIR response.

Figure 14:
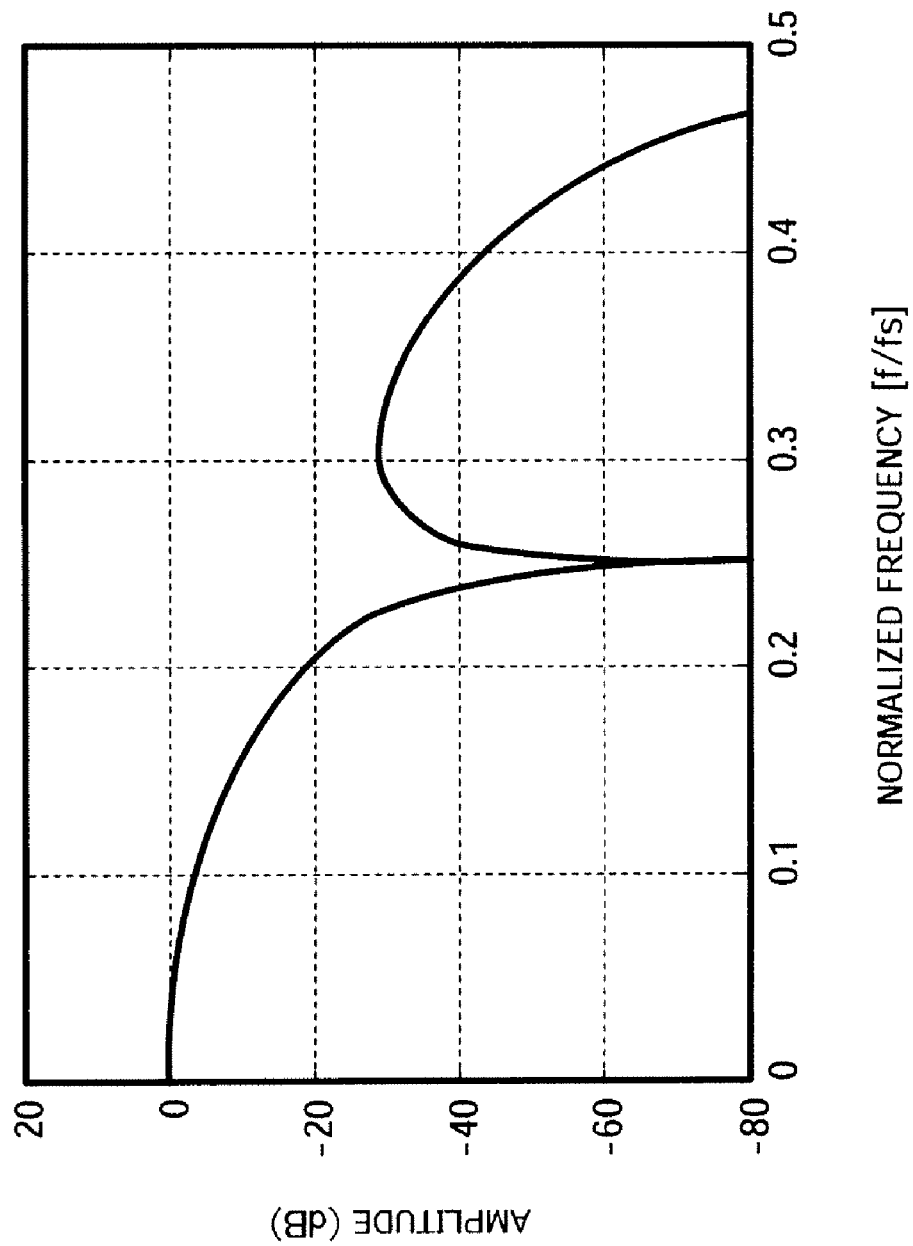
FIG. 14 is a diagram showing a filter characteristic realized in Embodiment 3 of the present invention.

FIG. 14 illustrates the filter characteristic of transfer function represented by equation 2 in discrete time direct sampling circuit 200. The horizontal axis shows that a frequency from a local frequency is normalized by a local frequency.

(Equation 2)

$$H(z) = \frac{(1+3z^{-1}+3z^{-2}+z^{-3})-(z^{-4}+3z^{-5}+3z^{-6}+z^{-7})}{1-z^{-2}} \quad [2]$$
$$= 1+3z^{-1}+4z^{-2}+4z^{-3}+3z^{-4}+z^{-5}$$
$$= (1+z^{-1})^2 \cdot (1+z^{-1}+z^{-2}+z^{-3})$$

Here, equation 2 does not describe the term of gain in an actual circuit strictly. Further, the gain of the vertical axis is acquired by normalizing the maximum gain by 0 dB.

As described above, in addition to the configuration in Embodiment 1, the present embodiment employs a configuration to provide a plurality of differential voltage-to-current convertors of different voltage-to-current conversion ratios, accumulate analog RF currents generated in the differential voltage-to-current convertors in separate electric charge sampling capacitors, and, upon reading, selectively connecting electric charge signals at predetermined past timing among the plurality of electric charge sampling capacitors and performing a combination while sharing electric charges. By employing this configuration, it is possible to realize a higher-order and complicated filter transfer function and realize a narrowband filter characteristic having a steep-blocking characteristic. Also, although conventional electric charge integration requires a filter characteristic of, for example, weighting with resolution level 4 for weighting of tap coefficients, an equivalent filter characteristic is possible by weighting with resolution level 2 with the present embodiment, so that it is possible to reduce the circuit scale.

Also, according to the above explanation, in direct sampling circuit 200, positive-phase mixer switches 2021 and 2022 and negative-phase mixer switches 2031 and 2032 sample the differential outputs of differential voltage-to-current convertors 2011 and 2012 having respective voltage-to-current conversion rates, by the same phases, thereby producing two positive-phase analog RF current signals and two negative-phase analog RF current signals. However, the present invention is not limited to this, and it is equally possible to use single-phase voltage-to-current convertors. That is, the output of the first single-phase voltage-to-current convertor is received as input in positive-phase mixer switch 2021 and negative-phase mixer switch 2031, the output of the second single-phase voltage-to-current convertor having a different voltage-to-current conversion rate from the first single-phase voltage-to-current convertor, is received as input in positive-phase mixer switch 2022 and negative-phase mixer switch 2032, and positive mixer switches 2021 and 2022 and negative-phase mixer switches 2031 and 2032 sample the input signals by the inverse phases, thereby forming two positive-phase analog RF current signals and two negative-phase analog RF current signals.

Also, it is needless to say that, if the operations are substantially equivalent to the features of the present embodiment, the configuration and details of control may vary within the range that can be attained by a skilled person. For example, a configuration has been described with the present embodiment where decimation is performed every two samples of the local frequency as the reading frequency from sampling taps, the present invention is not limited to this, and more decimation is possible by reading out electric charges accumulated in a history capacitor in a later stage, at a lower rate in a further later reading stage.

Embodiment 3

With the present embodiment, another configuration example will be explained which can realize a transfer filter characteristic to be realized in discrete time analog processing circuit 200 shown in Embodiment 2.

Figure 15:
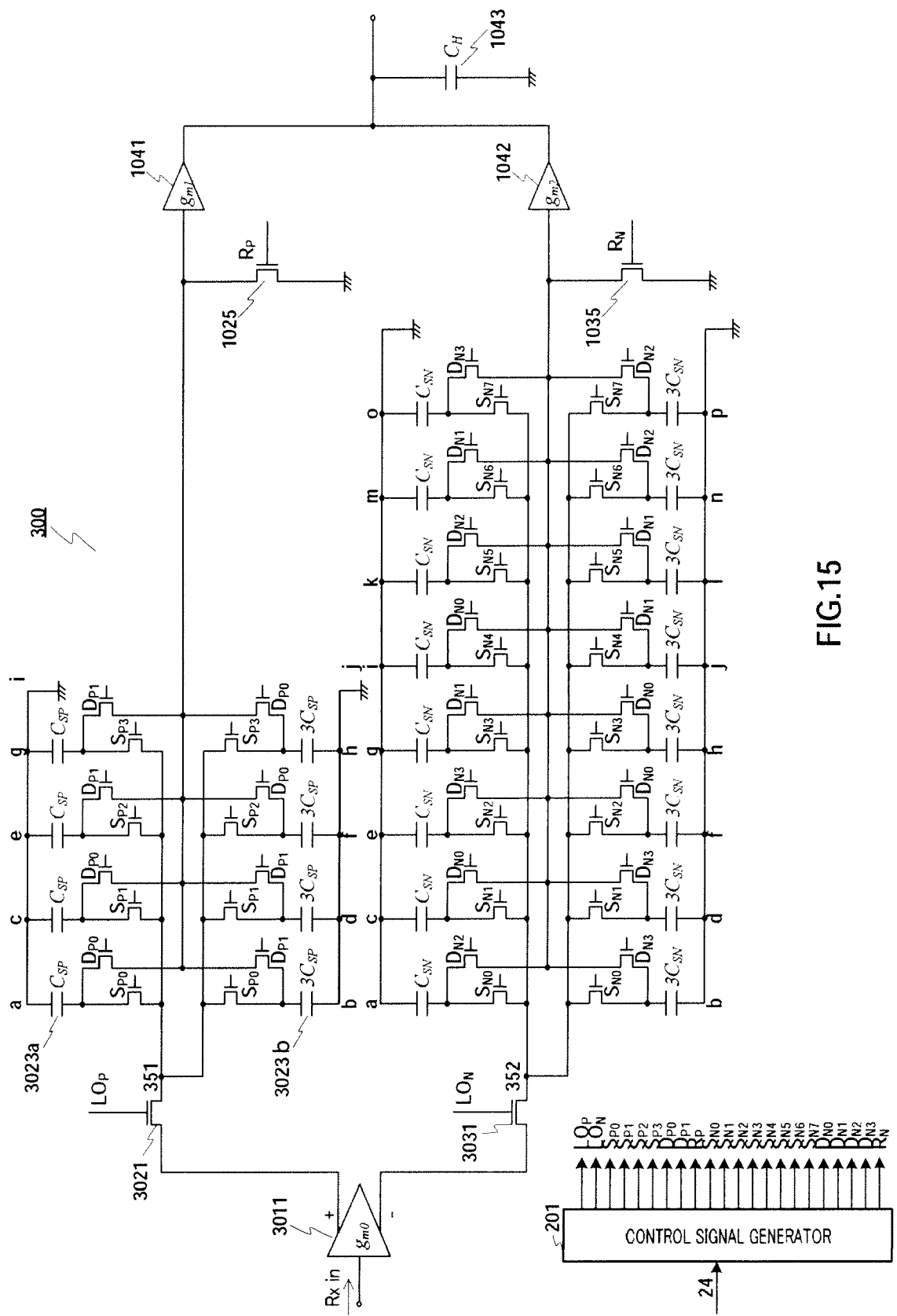
FIG. 15 is a diagram showing a circuit configuration example of a discrete time direct sampling circuit according to Embodiment 3 of the present invention.

FIG. 15 is a diagram showing the configuration of direct sampling circuit 300 used to explain the present embodiment. While direct sampling circuit 200 shown in FIG. 12 has two differential voltage-to-current convertors for an analog RF signal input, direct sampling circuit 300 has one differential voltage-to-current convertor for analog RF signal input. Further, direct sampling circuit 300 has one positive-phase mixer switch and one negative-phase mixer switch. Further, the output of the positive-phase mixer switch is supplied to all sampling taps in the positive-phase sampling mixer, and the output of the negative-phase mixer switch is supplied to all sampling taps in the negative-phase delay sampling mixer. Here, the positive-phase sampling mixer has eight sampling taps, and the capacitance of electric charge sampling capacitors included in half the sampling taps are three times as high as that of electric charge sampling capacitors included in the remaining half sampling taps.

Similarly, the negative-phase sampling mixer has sixteen sampling taps, and the capacitance of electric charge sampling capacitors included in half the sampling taps are three times as high as that of electric charge sampling capacitors included in the remaining half sampling taps. The configurations and operations of other components in FIG. 15 are the same as in Embodiment 2 and FIG. 1, and therefore their explanation will be omitted.

Figure 13:
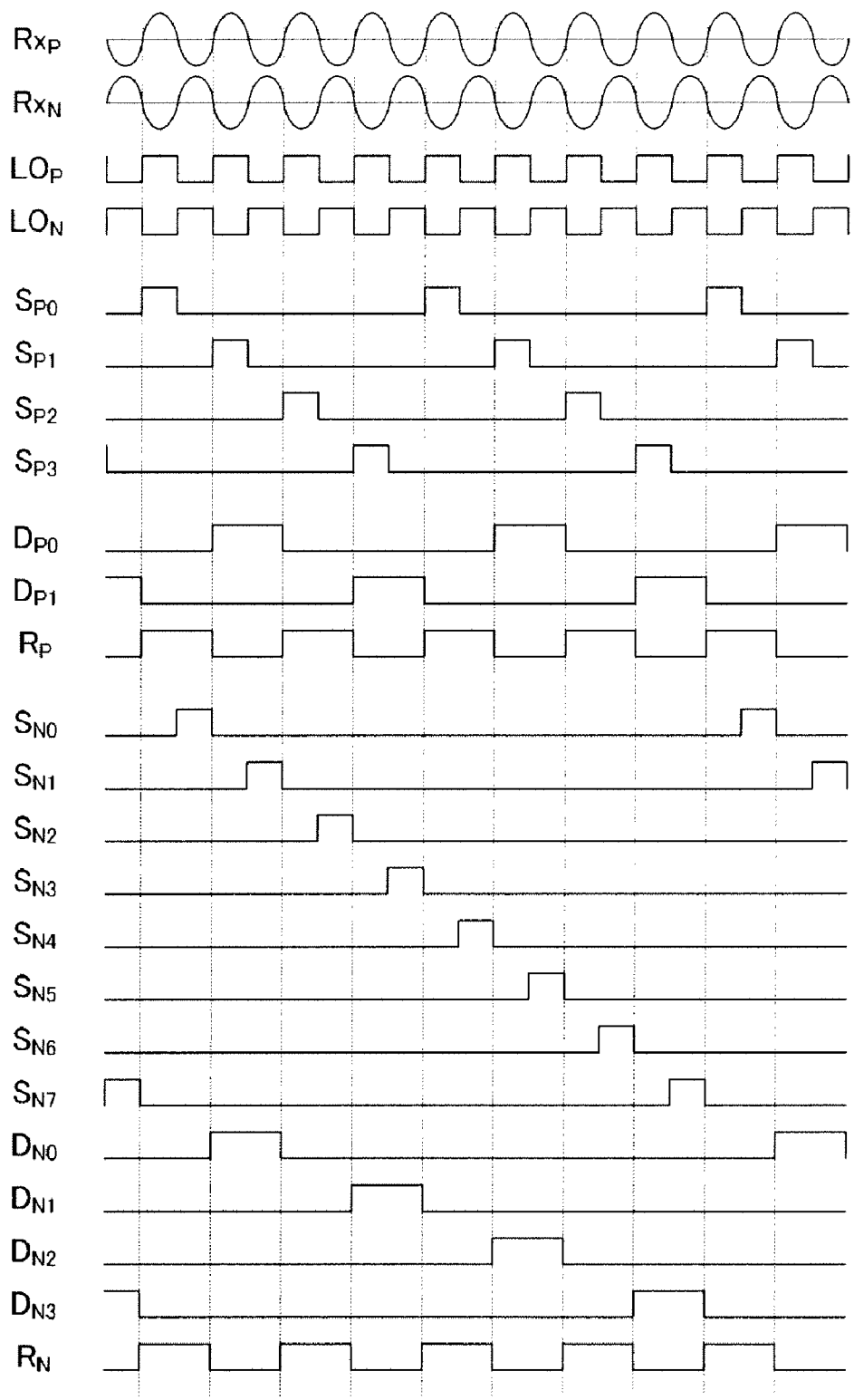
FIG. 13 is a diagram showing an example of a timing chart of control signals according to Embodiment 2 of the present invention.

In discrete time direct sampling circuit 300 formed as above, by generating control signals based on the timing chart shown in FIG. 13 in Embodiment 2 and controlling the operations of components, each sampling tap can accumulate and read out electric charges in the same way as in Embodiment 2 and FIG. 12, and, as a result, it is possible to realize the same filter transfer characteristic as in FIG. 14.

A received and amplified analog RF signal is converted to differential current signals by voltage-to-current conversion ratio $g_{m0}$ in differential voltage-to-current convertor 3011, and then outputted to positive-phase analog RF current signal 351 and negative-phase analog RF current signal 352. Positive-phase analog RF current signal 351 is sampled in mixer switch 3021 in a positive-phase sampling mixer, according to the timing of a local signal, and, according to four control signals $S_{P0}$ to $S_{P3}$ supplied in four pairs, the electric charges are held every pair of two connected electric charge sampling capacitors. In this case, the capacitance in one capacitor (e.g. 3023*b*) is three fold compared to the other capacitor (e.g. 3023*a*), and therefore capacitor 3023*b* accumulates three-fold electric charges compared to capacitor 3023*a*.

On the other hand, negative-phase RF current signal 352 is sampled in mixer switch 3031 in a negative-phase delay sampling mixer, according to the timing of a local signal, and, according to control signals $S_{N0}$ to $S_{N7}$ supplied in eight phases, the electric charges are held every pair of two connected electric sampling capacitors. Here, there is also a relationship that one capacitor has three-fold capacitance compared to the other capacitor, and therefore accumulates three-fold electric charges compared to the other capacitor.

As described above, according to the configuration and operations of the present embodiment, with a different configuration from that of Embodiment 2, it is possible to realize a high-order and complicated filter transfer function and realize a narrowband filter characteristic having a steep-blocking characteristic. Further, according to the configuration shown in FIG. 15, compared to the configuration shown in FIG. 12, the values of tap coefficients can be set by the relative ratio of capacitor capacities instead of the relative ratio of voltage-to-current conversion ratios, so that it is possible to set tap coefficients more accurately in the case of the configuration in a semiconductor circuit. Further, the number of differential voltage-to-current convertors need not be increased, so that the effect of reducing the circuit scale is expected.

Other Embodiment

In the above explanation, circuit configuration examples to realize a certain filter transfer characteristic based on the present invention are merely shown with the configurations of Embodiments 1 to 3, and the order of a filter based on the number of sampling taps and the resolutions of tap coefficients based on providing differential voltage-to-current convertors of different voltage-to-current conversion ratios and capacitors of different capacitances, are not limited to the above. It is not needless to say that it is possible to employ a configuration in which an optimal characteristic can be acquired based on a desirable performance system.

Figure 16:
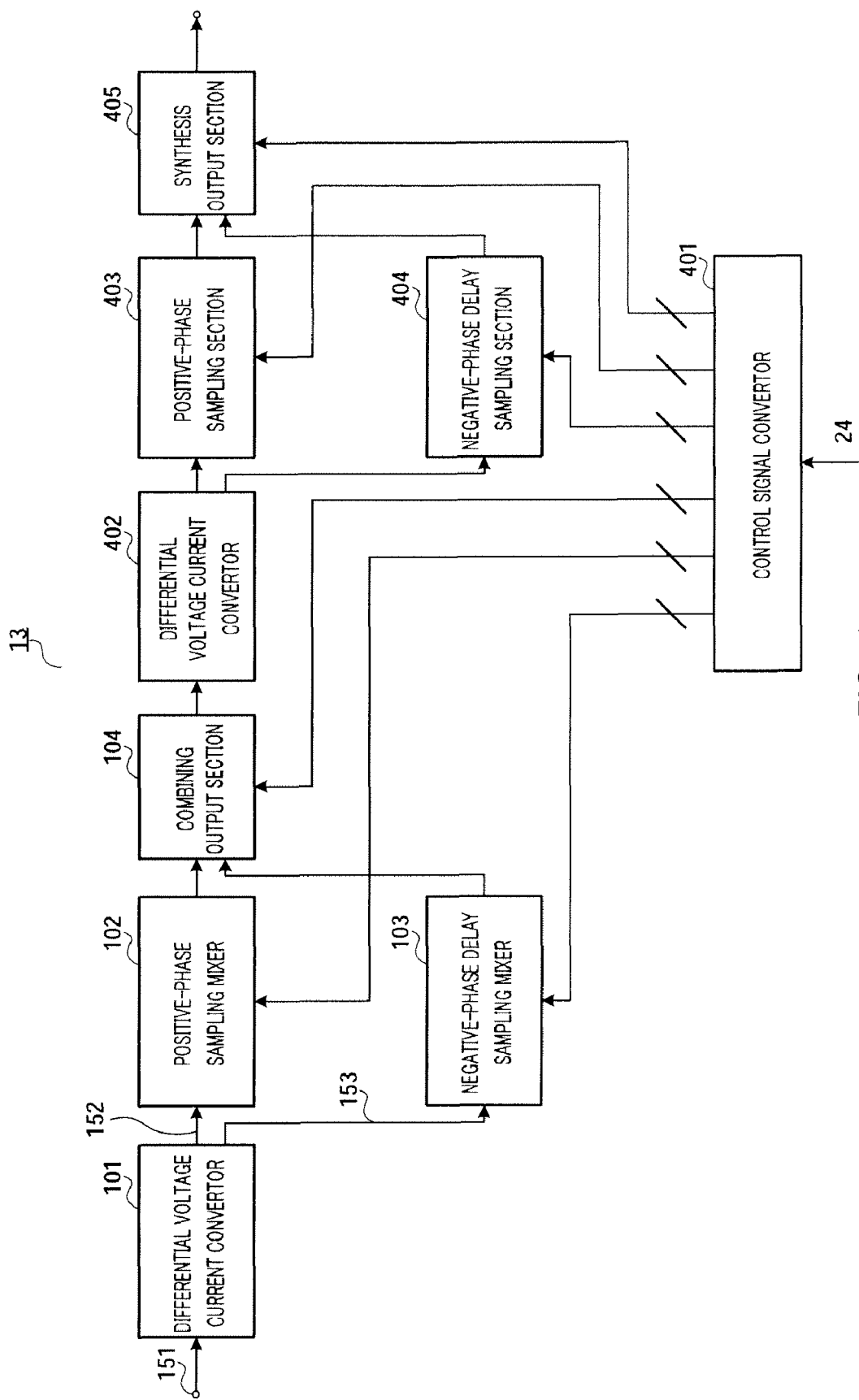
FIG. 16 is a diagram showing an example of a function block configuration with cascade connection of filter blocks according to other embodiment of the present invention.

Further, it is equally possible to realize an advanced filter transfer characteristic by cascade connection of the filter components according to the present invention as show in, for example, FIG. 16. In FIG. 16, positive-phase sampling section 403 is formed by eliminating mixer switch 1021 controlled by a local signal from positive-phase sampling mixer 102 illustrated in FIG. 5 and FIG. 6, and negative-phase delay sampling section 404 is formed by eliminating mixer switch 1031 controlled by a local signal from negative-phase delay sampling mixer 103 illustrated in FIG. 5 and FIG. 6. Thus, by providing the configuration shown in FIG. 17 by implementing cascade connection of filters having different characteristics and further implementing cascade connection of an IIR filter in a later stage, it is possible to realize the filter characteristic shown in FIG. 18.

Figure 17:
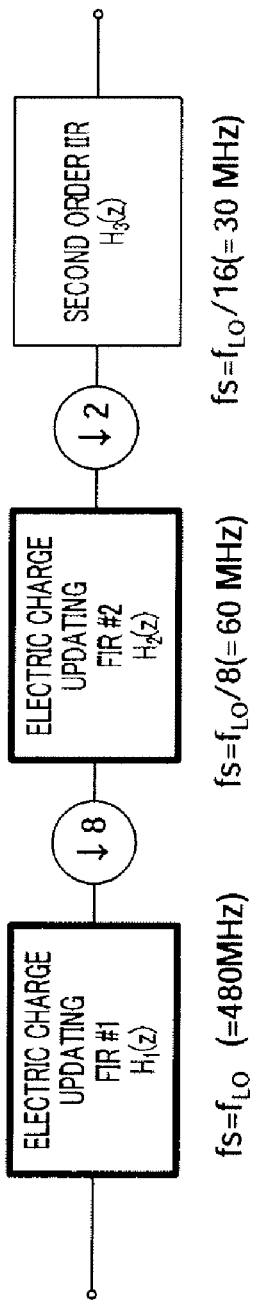
FIG. 17 is a diagram showing a design example by cascade connection of filter blocks according to other embodiment of the present invention.
Figure 18:
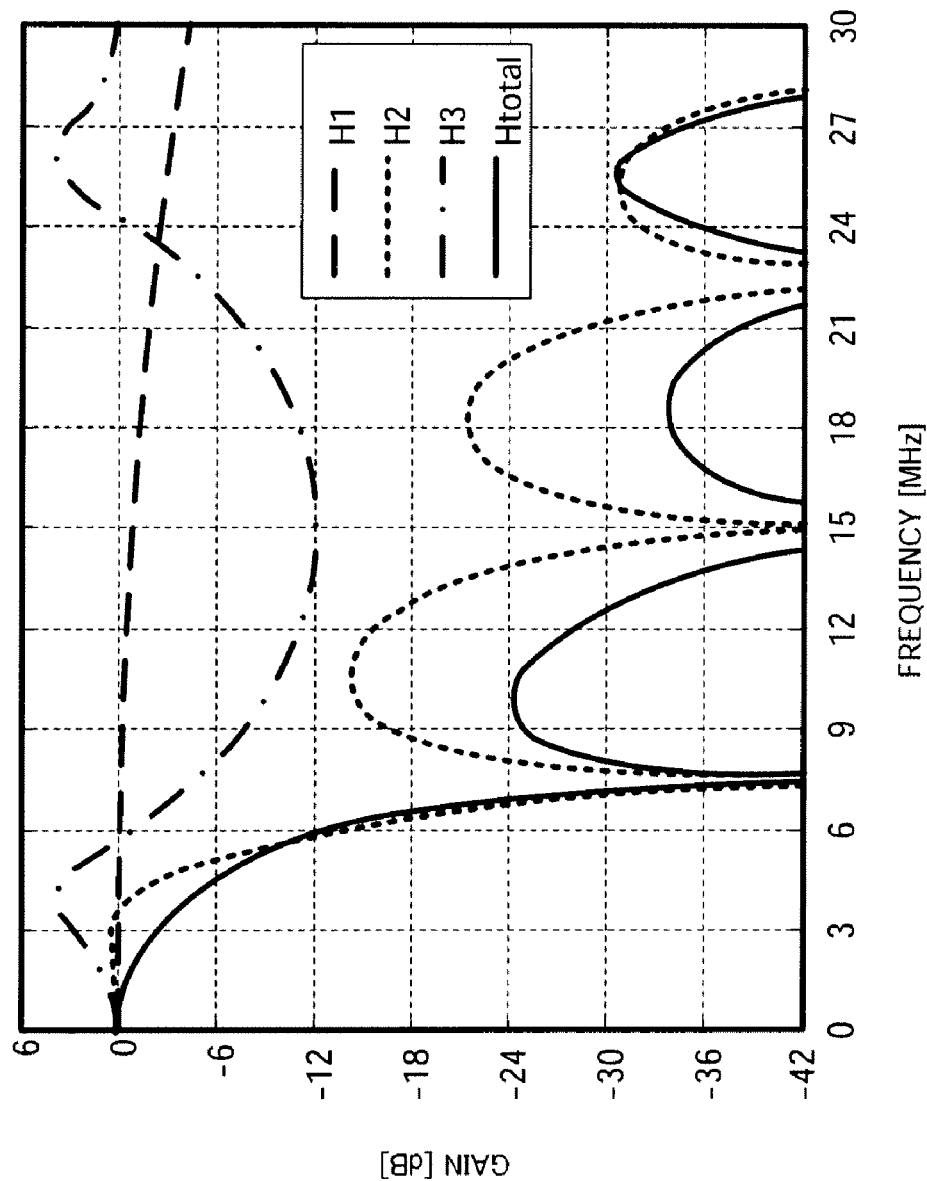
FIG. 18 is a diagram showing a filter characteristic in a design example by cascade connection of filter blocks according to other embodiment of the present invention.

In the configuration shown in FIG. 17, it is equally possible to form an IIR filter in the end of stages with a discrete time analog processing circuit or form the IIR filter with a digital filter, with digital values quantized by an A/D converter and so on.

The disclosure of Japanese Patent Application No. 2007-056409, filed on Mar. 6, 2007, including the specification, drawings and abstract, is incorporated herein by reference in its entirety.

INDUSTRIAL APPLICABILITY

The discrete time direct sampling circuit and receiver having discrete time direct sampling circuit according to the present embodiment are useful for a high frequency signal processing circuit in a receiver of a wireless communication apparatus, and suitable in a case of performing frequency conversion and filter processing of signals.

The invention claimed is:
1. A discrete time direct sampling circuit, comprising:
a first differential voltage-to-current convertor that converts an analog radio frequency signal input to differential analog radio frequency current signals, at a first predetermined voltage-to-current conversion rate;
a positive-phase sampling mixer that samples a positive-phase analog radio frequency current signal outputted from the first differential voltage-to-current convertor by a first sampling signal that is based on a local signal, and outputs the sampled signal at a timing in accordance with a first read control signal that is based on the local signal;
a negative-phase delay sampling mixer that samples a negative-phase analog radio frequency current signal outputted from the first differential voltage-to-current convertor, by a second sampling signal that is based on the local signal, and outputs the sampled signal at a timing in accordance with a second read control signal that is delayed to the timing in accordance with the first read control signal by a predetermined sample timing; and
a combining output section that combines a sampling value read out from the positive-phase sampling mixer and a sampling value read out from the negative-phase delay sampling mixer and outputs the combined value, wherein:
the positive phase sampling mixer comprises:
a first mixer switch that allows the positive-phase analog radio frequency current signal to pass, based on the local signal;

a plurality of first sampling taps that output electric charges charged by a current signal passing the first mixer switch based on first sampling control signals, according to the first read control signals that are based on the local signal; and a first reset switch that resets the electric charges charged in the plurality of first sampling taps, according to a reset control signal that is based on the local signal;

the negative-phase delay sampling mixer comprises:

a second mixer switch that allows the negative-phase analog radio frequency current signal to pass, based on the local signal;

a plurality of second sampling taps that that output electric charges charged by a current signal passing the second mixer switch based on second sampling control signals, according to the second read control signals that are based on the local signal; and a second reset switch that resets the electric charges charged in the plurality of second sampling taps, according to the reset control signal;

the first sampling control signals in the plurality of first sampling taps comprises control signals of varying sample timings;

the first read control signals in the plurality of first sampling taps comprise signals of varying sample timings;

the plurality of second sampling control signals in the plurality of first sampling taps comprise control signals of varying sample timings; and the second read control signals in the plurality of second sampling taps comprise signals of varying sample timings.

2. The discrete time direct sampling circuit according to claim 1, wherein the first and second sampling taps comprise:

an input terminal;

an output terminal;

an electric charge sampling capacitor of a predetermined capacitance, that charges and releases electric charges;

a sampling switch that controls a connection between the input terminal and the electric sampling capacitor, based on the first sampling control signal and the second sampling control signal; and a read switch that controls a connection between the electric charge sampling capacitor and the output terminal, based on the first read control signal and the second read control signal.

3. The discrete time direct sampling circuit according to claim 1, wherein the number of the second sampling taps is greater than the number of the first sampling taps.

4. A discrete time direct sampling circuit, comprising:

a first differential voltage-to-current convertor that converts an analog radio frequency signal input to differential analog radio frequency current signals, at a first predetermined voltage-to-current conversion rate;

a positive-phase sampling mixer that samples a positive-phase analog radio frequency current signal outputted from the first differential voltage-to-current convertor by a first sampling signal that is based on a local signal, and outputs the sampled signal at a timing in accordance with a first read control signal that is based on the local signal;

a negative-phase delay sampling mixer that samples a negative-phase analog radio frequency current signal outputted from the first differential voltage-to-current convertor, by a second sampling signal that is based on the local signal, and outputs the sampled signal at a timing in accordance with a second read control signal that is delayed to the timing in accordance with the first read control signal by a predetermined sample timing; and a combining output section that combines a sampling value read out from the positive-phase sampling mixer and a sampling value read out from the negative-phase delay sampling mixer and outputs the combined value, wherein the combining output section comprises:

a first voltage-to-current convertor that converts a sampling value from the positive-phase sampling mixer to a current at a predetermined second voltage-to-current conversion rate and outputs the current;

a second voltage-to-current convertor that converts a sampling value from the negative-phase delay sampling mixer to a current at a predetermined third voltage-to-current conversion rate and outputs the current; and a history capacitor that combines the currents outputted from the first voltage-to-current convertor and the second voltage-to-current convertor, and electric charges accumulated at a predetermined sample timing.

5. A discrete time direct sampling circuit, comprising:

a first differential voltage-to-current convertor that converts an analog radio frequency signal input to differential analog radio frequency current signals, at a first predetermined voltage-to-current conversion rate;

a positive-phase sampling mixer that samples a positive-phase analog radio frequency current signal outputted from the first differential voltage-to-current convertor by a first sampling signal that is based on a local signal, and outputs the sampled signal at a timing in accordance with a first read control signal that is based on the local signal;

a negative-phase delay sampling mixer that samples a negative-phase analog radio frequency current signal outputted from the first differential voltage-to-current convertor, by a second sampling signal that is based on the local signal, and outputs the sampled signal at a timing in accordance with a second read control signal that is delayed to the timing in accordance with the first read control signal by a predetermined sample timing; and a combining output section that combines a sampling value read out from the positive-phase sampling mixer and a sampling value read out from the negative-phase delay sampling mixer and outputs the combined value, wherein the combining output section comprises:

a first buffer that buffers a signal voltage from the positive-phase sampling mixer;

a second buffer that buffers a signal voltage from the negative-phase delay sampling mixer;

a voltage adding section that adds the signal voltage outputted from the first buffer and the signal voltage outputted from the second buffer, and outputs a sum voltage;

an analog-to-digital convertor that quantizes the sum voltage to a digital value at a predetermined sampling frequency; and a recursive addition section that adds the sum voltage converted to the digital value and a sum voltage at a predetermined sample timing.

6. A discrete time direct sampling circuit, comprising:

a first differential voltage-to-current convertor that converts an analog radio frequency signal input to differential analog radio frequency current signals, at a first predetermined voltage-to-current conversion rate;

a positive-phase sampling mixer that samples a positive-phase analog radio frequency current signal outputted from the first differential voltage-to-current convertor by a first sampling signal that is based on a local signal, and outputs the sampled signal at a timing in accordance with a first read control signal that is based on the local signal;

a negative-phase delay sampling mixer that samples a negative-phase analog radio frequency current signal outputted from the first differential voltage-to-current convertor, by a second sampling signal that is based on the local signal, and outputs the sampled signal at a timing in accordance with a second read control signal that is delayed to the timing in accordance with the first read control signal by a redetermined sample timing; and a combining output section that combines a sampling value read out from the positive-phase sampling mixer and a sampling value read out from the negative-phase delay sampling mixer and outputs the combined value, wherein:

the positive sampling mixer comprises a plurality of sampling taps that sample an input current signal according to the first sampling signals, in which the first sampling signals vary between the plurality of sampling taps, and in which the first read control signals comprise signals to select and read out a plurality of electric charge samples at timings varying one sample timing each between the plurality of sampling taps, at a timing based on a predetermined output sampling frequency; and the negative-phase delay sampling mixer comprises a plurality of sampling taps that sample an input current signal based on the second sampling signals, in which the second sampling signals vary between the plurality of sampling taps, and in which the second read control signals comprise signals to select and read out a plurality of electric charge samples at timings varying one sample timing each between the plurality of sampling taps, at a timing based on a predetermined output sampling frequency.

7. The discrete time direct sampling circuit according to claim 6, wherein, among the plurality of sampling taps, a ratio between a capacitance of electric charge sampling capacitors contained in predetermined sampling taps and a capacitance of electric charge sampling capacitors contained in sampling taps other than the predetermined sampling taps, is set to a predetermined relative ratio.

8. A discrete time direct sampling circuit, comprising:
a first differential voltage-to-current convertor that converts an analog radio frequency signal input to differential analog radio frequency current signals, at a first predetermined voltage-to-current conversion rate;
a positive-phase sampling mixer that samples a positive-phase analog radio frequency current signal outputted from the first differential voltage-to-current convertor by a first sampling signal that is based on a local signal, and outputs the sampled signal at a timing in accordance with a first read control signal that is based on the local signal;
a negative-phase delay sampling mixer that samples a negative-phase analog radio frequency current signal outputted from the first differential voltage-to-current convertor, by a second sampling signal that is based on the local signal, and outputs the sampled signal at a timing in accordance with a second read control signal that is delayed to the timing in accordance with the first read control signal by a predetermined sample timing;
a combining output section that combines a sampling value read out from the positive-phase sampling mixer and a sampling value read out from the negative-phase delay sampling mixer and outputs the combined value; and a second differential voltage-to-current convertor that converts the analog radio frequency signal input into differential analog radio frequency current signals at a fourth voltage-to-current conversion rate different from the first voltage-to-current conversion rate, wherein:

the positive-phase sampling mixer comprises:
a third mixer switch that passes and outputs a positive-phase analog current output of the first differential voltage-to-current convertor according to the local signal;
a fourth mixer switch that passes and outputs a positive-phase analog current output of the second differential voltage-to-current convertor according to the local signal; and
a plurality of sampling taps that are connected parallel to output sides of the third and fourth mixer switches; and the negative-phase delay sampling mixer comprises:
a fifth mixer switch that passes and outputs a negative-phase analog current output of the first differential voltage-to-current convertor according to the local signal;
a sixth mixer switch that passes and outputs a negative-phase analog current output of the second differential voltage-to-current convertor according to the local signal; and
a plurality of sampling taps that are connected in parallel to output sides of the fifth and sixth mixer switches.

9. A discrete time direct sampling circuit, comprising:
a first differential voltage-to-current convertor that converts an analog radio frequency signal input to differential analog radio frequency current signals, at a first predetermined voltage-to-current conversion rate;
a positive-phase sampling mixer that samples a positive-phase analog radio frequency current signal outputted from the first differential voltage-to-current convertor by a first sampling signal that is based on a local signal, and outputs the sampled signal at a timing in accordance with a first read control signal that is based on the local signal;
a negative-phase delay sampling mixer that samples a negative-phase analog radio frequency current signal outputted from the first differential voltage-to-current convertor, by a second sampling signal that is based on the local signal, and outputs the sampled signal at a timing in accordance with a second read control signal that is delayed to the timing in accordance with the first read control signal by a predetermined sample timing; and
a combining output section that combines a sampling value read out from the positive-phase sampling mixer and a sampling value read out from the negative-phase delay sampling mixer and outputs the combined value, replacing the first differential voltage-to-current convertor with a third voltage-to-current convertor that converts an analog radio frequency signal input to a single-phase analog radio frequency current signal at a predetermined fifth voltage-to-current conversion rate,
wherein the local signal supplied to the negative-phase delay sampling mixer comprises a local signal with an inverse phase compared to a local signal supplied to the positive-phase sampling mixer.

10. A discrete time direct sampling circuit, comprising:
a first differential voltage-to-current convertor that converts an analog radio frequency signal input to differential analog radio frequency current signals, at a first predetermined voltage-to-current conversion rate;

a positive-phase sampling mixer that samples a positive-phase analog radio frequency current signal outputted from the first differential voltage-to-current convertor by a first sampling signal that is based on a local signal, and outputs the sampled signal at a timing in accordance with a first read control signal that is based on the local signal;

a negative-phase delay sampling mixer that samples a negative-phase analog radio frequency current signal outputted from the first differential voltage-to-current convertor, by a second sampling signal that is based on the local signal, and outputs the sampled signal at a timing in accordance with a second read control signal that is delayed to the timing in accordance with the first read control signal by a predetermined sample timing; and a combining output section that combines a sampling value read out from the positive-phase sampling mixer and a sampling value read out from the negative-phase delay sampling mixer and outputs the combined value, supplying a negative-phase local signal having an inverse phase to the local signal is provided, and comprising a negative-phase sampling processing system that acquires an output on a negative-phase side by performing same processing as discrete time sampling processing on a positive-phase side, for the analog radio frequency signal input at a sample timing of the negative-phase local signal, and outputting a differential discrete time analog signal.

11. A discrete time direct sampling circuit comprising:

a signal forming section that forms a positive-phase radio frequency signal and negative-phase radio frequency signal from a radio frequency signal;

a positive-phase sampling mixer that samples the positive radio frequency signal;

a negative-phase sampling mixer that samples the negative-phase radio frequency signal; and a combining output section that combines a sample signal released from the positive-phase sampling mixer and a sample signal released from the negative-phase sampling mixer, and outputs a combined signal, wherein:

the positive-phase sampling mixer comprises N positive-phase sampling taps that are connected in order to the signal forming section at one-Nth frequencies of the local signal, and that perform integration in different periods of the positive radio frequency signal;

the N positive-phase sampling taps release the integrated positive-phase radio frequency signals, so as to synchronize a period to release the positive-phase radio frequency signal integrated in one positive-phase sampling tap and a period to integrate a positive-phase radio frequency signal in another positive-phase sampling tap;

the negative-phase sampling mixer comprises M negative-phase sampling taps that are connected in order to the signal forming section at one-Mth frequencies of the local signal, in synchronization with integration periods of the N positive-phase sampling taps, and that integrate the negative-phase radio frequency signals of different periods; and the M negative-phase sampling taps release the negative-phase radio frequency signals integrated before the integration period in which positive-phase radio frequency signals released from the positive-phase sampling mixer are integrated, such that a period to release a negative-phase analog radio frequency current signal integrated in an arbitrary negative-phase sampling tap and a period to integrate a negative-phase analog radio frequency signal in a negative-phase sampling tap different from the arbitrary negative-phase sampling tap, are synchronized, and that the M negative-phase sampling taps are synchronized with release periods of the N positive-phase sampling taps.

12. The discrete time direct sampling circuit according to claim 11, wherein the positive-phase sampling taps and the negative-phase sampling taps comprise:

a capacitor;

an input switch that switches a connection state between the signal forming section and the capacitor; and an output switch that switches a connection state between the capacitor and the combining output section.

13. The discrete time direct sampling circuit according to claim 11, wherein:

the signal forming section forms a first positive-phase radio frequency signal, second positive-phase radio frequency signal having an amplitude A times the first positive-phase radio frequency signal, first negative-phase radio frequency signal and second negative-phase radio frequency signal having an amplitude A times the first negative-phase radio frequency signal;

the positive-phase sampling tap comprises:

first and second capacitors that are provided parallel to the signal forming section and have a same capacitance;

a first input switch that switches a connection state between the signal forming section and the first and second capacitors;

a first output switch that switches a connection state between the first capacitor and the combining output section; and a second output switch that switches a connection state between the second capacitor and the combining output section;

the first positive-phase radio frequency signal is received as input in the first capacitor, and the second positive-phase radio frequency signal is received as input in the second capacitor;

the negative-phase sampling tap comprises:

third and fourth capacitors that are provided parallel to the signal forming section and have a same capacitance;

a second input switch that switches a connection state between the signal forming section and the third and fourth capacitors;

a third output switch that switches a connection state between the third capacitor and the combining output section; and a second output switch that switches a connection state between the second capacitor and the combining output section;

the first negative-phase radio frequency signal is received as input in the third capacitor, and the second negative-phase radio frequency signal is received as input in the fourth capacitor;

the first and second output switches of a same positive-phase sampling tap are turned on in different release periods; and the third and fourth output switches of a same negative-phase sampling tap are turned on in different release periods.

14. The discrete time direct sampling circuit according to claim 13, wherein:

a first output switch of a first positive-phase sampling tap and a second output switch of a second positive-phase sampling tap are turned on in a same release period;

a second output switch of the first positive-phase sampling tap and a first output switch of the second positive-phase sampling tap are turned on in a different release period from the period when the first output switch of the first positive-phase sampling tap and the second output switch of the second positive-phase sampling tap are turned on;

a third output switch of a first negative-phase sampling tap and a fourth output switch of a second negative-phase sampling tap are turned on in a same release period; and a fourth output switch of the first negative-phase sampling tap and a third output switch of the second negative-phase sampling tap are turned on in a different release period from the period when the third output switch of the first negative-phase sampling tap and the fourth output switch of the second negative-phase sampling tap are turned on.

15. The discrete time direct sampling circuit according to claim 13, wherein the signal forming section comprises:

a first differential voltage-to-current convertor that converts a radio frequency signal to the first positive-phase radio frequency signal and the first negative-phase radio frequency signal at a first voltage-to-current conversion rate;

a second differential voltage-to-current convertor that converts the radio frequency signal to the second positive-phase radio frequency signal and the second negative-phase radio frequency signal at a second voltage-to-current conversion rate different from the first voltage-to-current conversion rate;

a positive-phase mixer switch that samples the first positive-phase radio frequency signal and the second positive-phase radio frequency signal; and a negative-phase mixer switch that samples the first negative-phase radio frequency signal and the second negative-phase radio frequency signal at the same phase as in the positive-phase mixer switch.

16. The discrete time direct sampling circuit according to claim 13, wherein the signal forming section comprises:

a first voltage-to-current convertor that converts a radio frequency signal to a first single-phase radio frequency signal at a first voltage-to-current conversion rate;

a second voltage-to-current convertor that converts the radio frequency signal to a second single-phase radio frequency signal at a second voltage-to-current conversion rate different from the first voltage-to-current conversion rate;

a positive-phase mixer switch that forms the first positive-phase radio frequency signal and the second positive-phase radio frequency signal by sampling the first single-phase radio frequency signal and the second single-phase radio frequency signal; and a negative-phase mixer switch that forms the first negative-phase radio frequency signal and the second negative-phase radio frequency signal by sampling the first single-phase radio frequency signal and the second single-phase radio frequency signal by an inverse phase.

17. The discrete time direct sampling circuit according to claim 11, wherein:

the positive-phase sampling tap comprises:

first and second capacitors that are provided parallel to the signal forming section and have a same capacitance;

a first input switch that switches a connection state between the signal forming section and the first and second capacitors; a first output switch that switches a connection state between the first capacitor and the combining output section; and a second output switch that switches a connection state between the second capacitor and the combining output section;

the negative-phase sampling tap comprises:

third and fourth capacitors that are provided parallel to the signal forming section and have a same capacitance;

a second input switch that switches a connection state between the signal forming section and the third and fourth capacitors;

a third output switch that switches a connection state between the third capacitor and the combining output section; and a second output switch that switches a connection state between the second capacitor and the combining output section;

the first and second output switches of a same positive-phase sampling tap are turned on in different release periods; and the third and fourth output switches of a same negative-phase sampling tap are turned on in different release periods.

* * * * *